United States Patent
Han et al.

(10) Patent No.: US 10,249,627 B2
(45) Date of Patent: Apr. 2, 2019

(54) SEMICONDUCTOR DEVICE

(71) Applicant: Samsung Electronics Co., Ltd., Suwon-si (KR)

(72) Inventors: Jung Hoon Han, Hwaseong-si (KR); Dong Wan Kim, Hwaseong-si (KR); Ji Hun Kim, Hwaseong-si (KR); Jae Joon Song, Suwon-si (KR); Hiroshi Takeda, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/621,315

(22) Filed: Jun. 13, 2017

(65) Prior Publication Data

US 2018/0122810 A1 May 3, 2018

(30) Foreign Application Priority Data

Nov. 3, 2016 (KR) .................. 10-2016-0145892

(51) Int. Cl.
*H01L 27/108* (2006.01)
*H01L 49/02* (2006.01)

(52) U.S. Cl.
CPC .. *H01L 27/10814* (2013.01); *H01L 27/10855* (2013.01); *H01L 28/60* (2013.01); *H01L 28/87* (2013.01)

(58) Field of Classification Search
CPC .................... H01L 27/10814; H01L 28/60
See application file for complete search history.

(56) References Cited

U.S. PATENT DOCUMENTS

| 6,461,911 B2* | 10/2002 | Ahn ............... H01L 21/76897 257/298 |
| 6,762,110 B1* | 7/2004 | Masuda ........... H01L 27/10814 257/E21.011 |
| 6,965,139 B2 | 11/2005 | Ohno |
| 2004/0084709 A1* | 5/2004 | Kim ................ H01L 27/10811 257/306 |
| 2005/0045933 A1 | 3/2005 | Kimura et al. |
| 2005/0051824 A1* | 3/2005 | Iizuka ................ C23C 16/405 257/306 |

(Continued)

FOREIGN PATENT DOCUMENTS

| JP | 2000-332216 A | 11/2000 |
| JP | 2012-231075 A | 11/2012 |
| KR | 10-0533959 B1 | 11/2005 |

*Primary Examiner* — Walter H Swanson
(74) *Attorney, Agent, or Firm* — Muir Patent Law, PLLC

(57) ABSTRACT

A semiconductor device is provided. The semiconductor device includes an upper interlayer insulating layer disposed on a substrate. A first electrode spaced apart from the upper interlayer insulating layer is disposed on the substrate. A contact structure penetrating the upper interlayer insulating layer is disposed on the substrate. An upper support layer having a first portion covering an upper surface of the upper interlayer insulating layer, to surround an upper side surface of the contact structure, and a second portion extending in a horizontal direction from the first portion and surrounding an upper side surface of the first electrode, is disposed. A dielectric conformally covering the first electrode and a second electrode on the dielectric are disposed.

19 Claims, 20 Drawing Sheets

(56) References Cited

U.S. PATENT DOCUMENTS

| | | | |
|---|---|---|---|
| 2006/0063324 A1 | 3/2006 | Park et al. | |
| 2006/0192236 A1* | 8/2006 | Inoue | H01L 21/76802 |
| | | | 257/296 |
| 2006/0199330 A1 | 9/2006 | Nakamura et al. | |
| 2008/0135910 A1* | 6/2008 | Youn | H01L 27/0733 |
| | | | 257/311 |
| 2009/0140397 A1 | 6/2009 | Sukekawa | |
| 2011/0006353 A1* | 1/2011 | Kim | H01L 27/10814 |
| | | | 257/300 |
| 2011/0165756 A1 | 7/2011 | Isogai | |
| 2012/0273922 A1 | 11/2012 | Ueda | |
| 2013/0062679 A1* | 3/2013 | Manabe | H01L 21/743 |
| | | | 257/306 |
| 2013/0285203 A1 | 10/2013 | Hiroi et al. | |
| 2014/0138794 A1* | 5/2014 | Yang | H01L 27/10852 |
| | | | 257/532 |
| 2014/0308794 A1* | 10/2014 | Lee | H01L 21/76855 |
| | | | 438/381 |
| 2015/0371895 A1* | 12/2015 | Yokomichi | H01L 21/76897 |
| | | | 438/381 |
| 2017/0200673 A1* | 7/2017 | Lai | H01L 21/02532 |

\* cited by examiner

SEMICONDUCTOR DEVICE

CROSS-REFERENCE TO RELATED APPLICATION

This application claims benefit of priority under 35 U.S.C § 119 to Korean Patent Application No. 10-2016-0145892 filed on Nov. 3, 2016 in the Korean Intellectual Property Office, the disclosure of which is incorporated herein by reference in its entirety.

BACKGROUND

1. Field

The present disclosure relates to a semiconductor device including a support layer and a contact structure, and a method of manufacturing the same.

2. Description of Related Art

Recently, research into how to reduce a size of the elements constituting a semiconductor device and how to improve performance thereof has been conducted. Research has also been conducted into cell capacitors whose size is reduced but which may be stably and reliably formed in a dynamic random access memory (DRAM).

SUMMARY

An aspect of the present disclosure provides a structure of a semiconductor device for improving reliability and a formation method thereof.

According to an aspect of the present disclosure, a semiconductor device is provided. The semiconductor device includes an upper interlayer insulating layer disposed on a substrate. A first electrode spaced apart from the upper interlayer insulating layer is disposed on the substrate. A contact structure penetrating the upper interlayer insulating layer is disposed on the substrate. An upper support layer, having a first portion covering an upper surface of the upper interlayer insulating layer and surrounding an upper side surface of the contact structure, and a second portion extending in a horizontal direction from the first portion and surrounding an upper side surface of the first electrode, is disposed. A dielectric conformally covering the first electrode, and a second electrode on the dielectric, are disposed.

According to an aspect of the present disclosure, a semiconductor device is provided. The semiconductor device includes an interlayer insulating layer disposed on a substrate. An upper support layer having a first portion covering an upper surface of the interlayer insulating layer and a second portion formed to extend in a horizontal direction from the first portion is disposed. A contact structure penetrating the first portion of the upper support layer and the interlayer insulating layer is disposed. A data storage element spaced apart from the contact structure is disposed on the substrate. The data storage element includes a first electrode spaced apart from the interlayer insulating layer, a dielectric on the first electrode, and a second electrode on the dielectric. An upper side surface of the first electrode is surrounded by the second portion of the upper support layer, an upper side surface of the contact structure is surrounded by the first portion of the upper support layer and is in contact with the first portion, at least a portion of the upper side surface of the first electrode is in contact with the second portion of the upper support layer, and the second electrode covers an upper surface of the second portion of the upper support layer.

According to an aspect of the present disclosure, a semiconductor device is provided. The semiconductor device includes a first interlayer insulating layer disposed on a substrate; a second interlayer insulating layer on the first interlayer insulating layer; a first support layer between the first interlayer insulating layer and the second interlayer insulating layer; a second support layer on an upper surface of the second interlayer insulating layer; a first electrode disposed on the substrate and spaced apart from the first and second interlayer insulating layers; a contact structure disposed on the substrate and penetrating the first interlayer insulating layer, the first support layer, the second interlayer insulating layer and the second support layer; a dielectric conformally covering the first electrode; and a second electrode on the dielectric. The second support layer includes a first portion covering an upper surface of the second interlayer insulating layer and surrounding an upper side surface of the contact structure, and a second portion extending in a horizontal direction from the first portion and contacting a portion of an upper side surface of the first electrode.

BRIEF DESCRIPTION OF DRAWINGS

The above and other aspects, features and other advantages of the present disclosure will be more clearly understood from the following detailed description, taken in conjunction with the accompanying drawings.

DETAILED DESCRIPTION

Figure 1A:
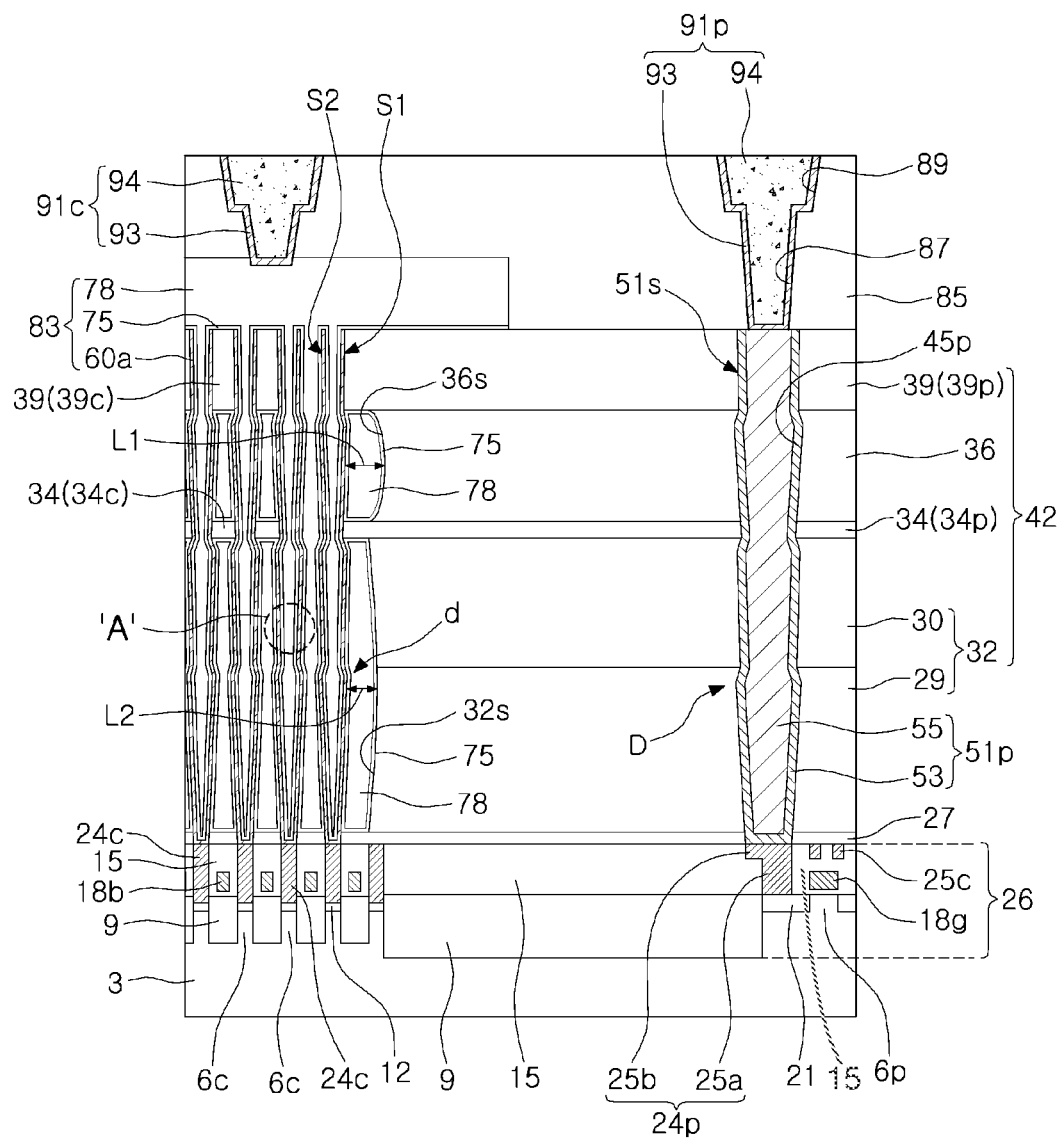
FIG. 1A is a cross-sectional view illustrating an example of a semiconductor device according to an example embodiment.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

As used herein, and unless indicated otherwise, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) that does not permit electric current to pass therethrough is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Figure 1B:
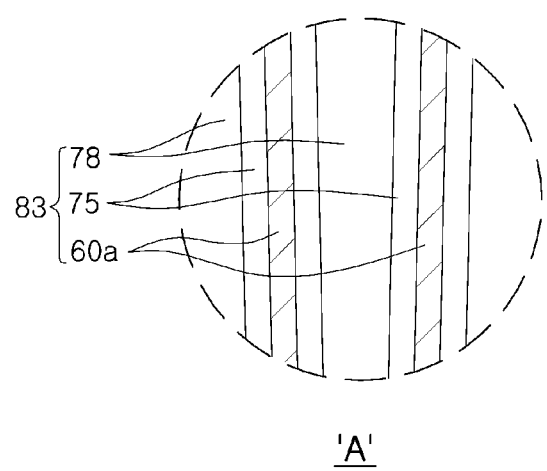
FIG. 1B is a partially enlarged view in which a portion of FIG. 1A is enlarged.
Figure 2:
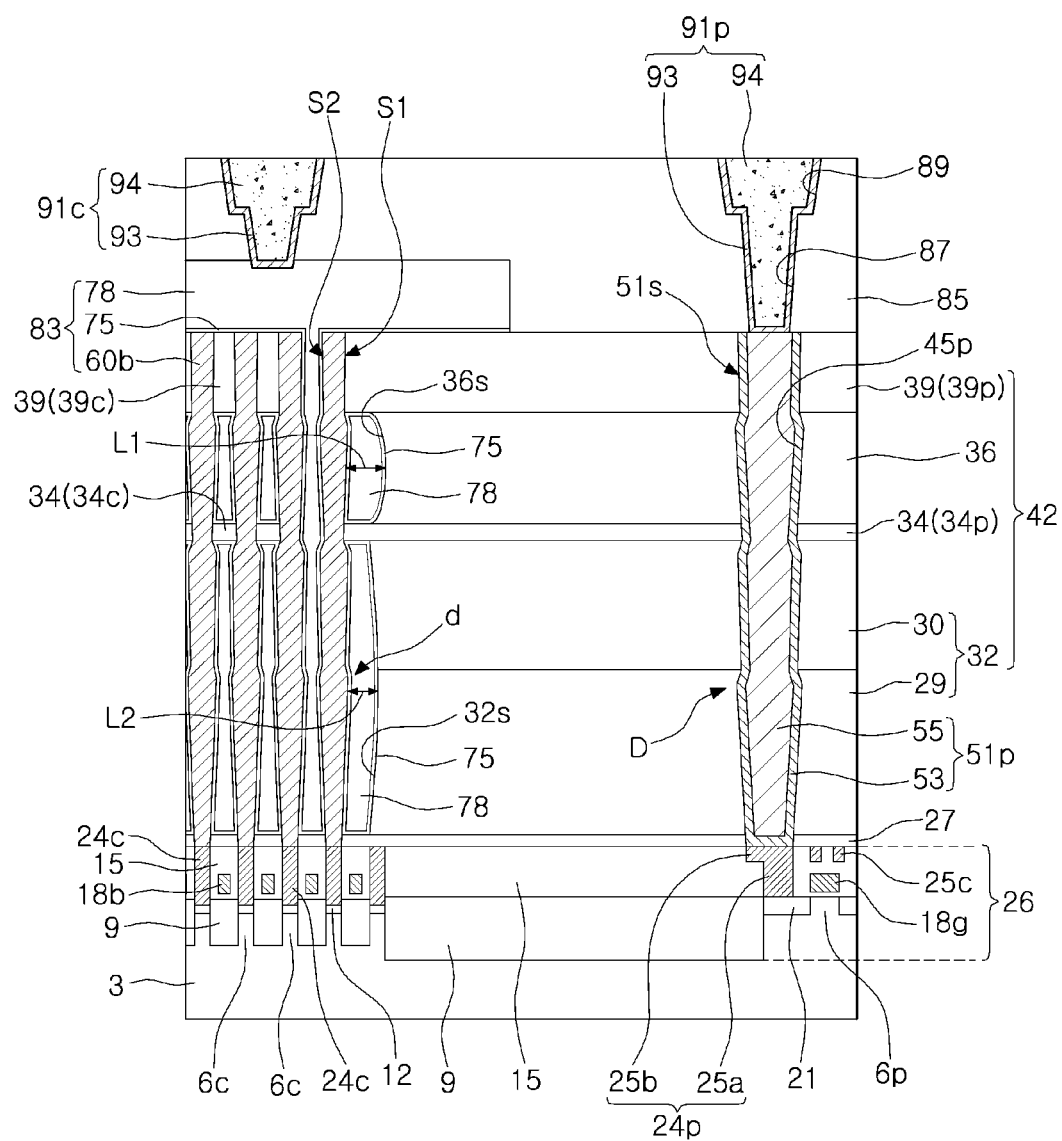
FIG. 2 is a cross-sectional view illustrating a modified example of a semiconductor device according to an example embodiment.
Figure 3A:
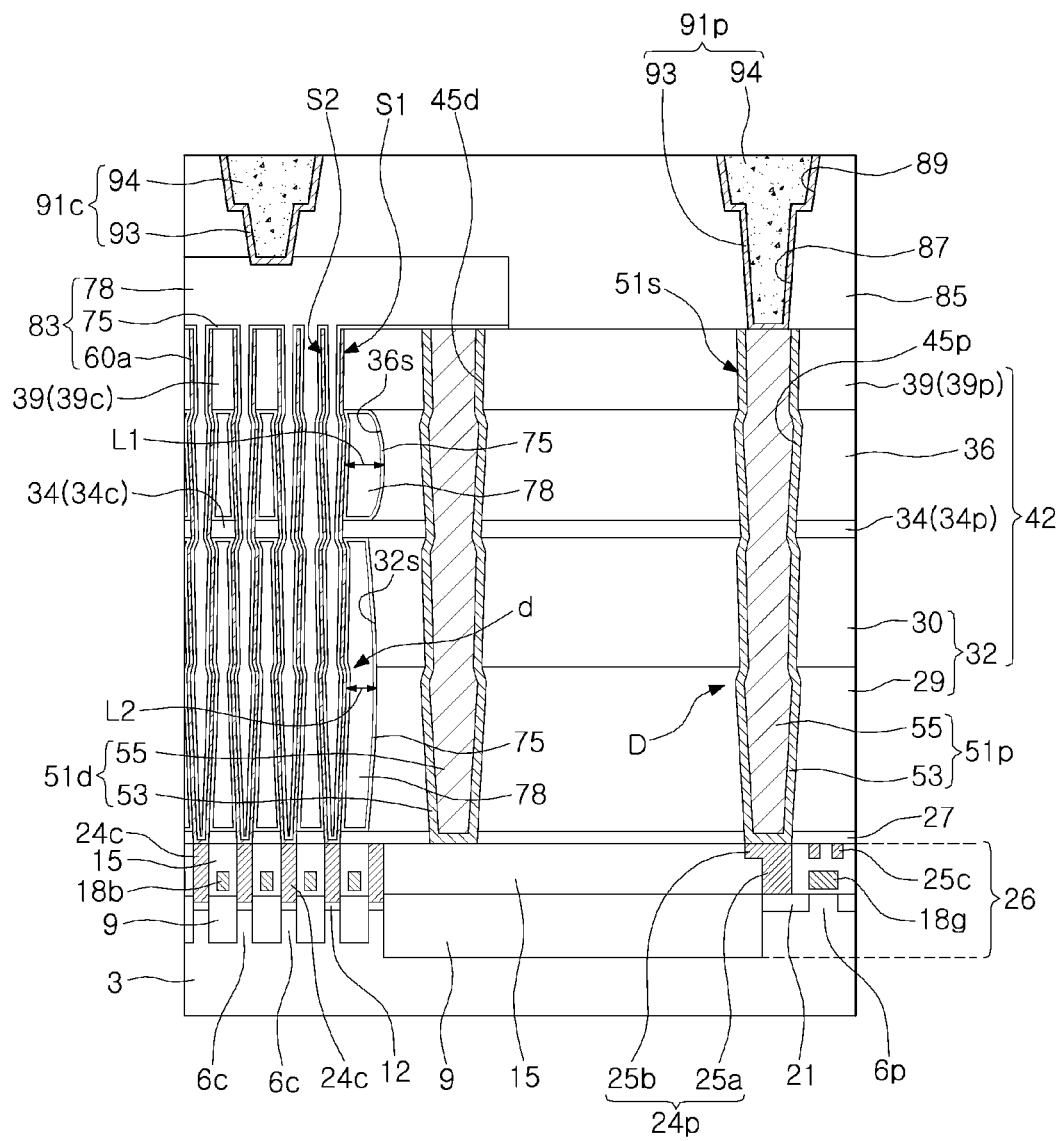
FIG. 3A is a cross-sectional view illustrating another modified example of a semiconductor device according to an example embodiment.
Figure 3B:
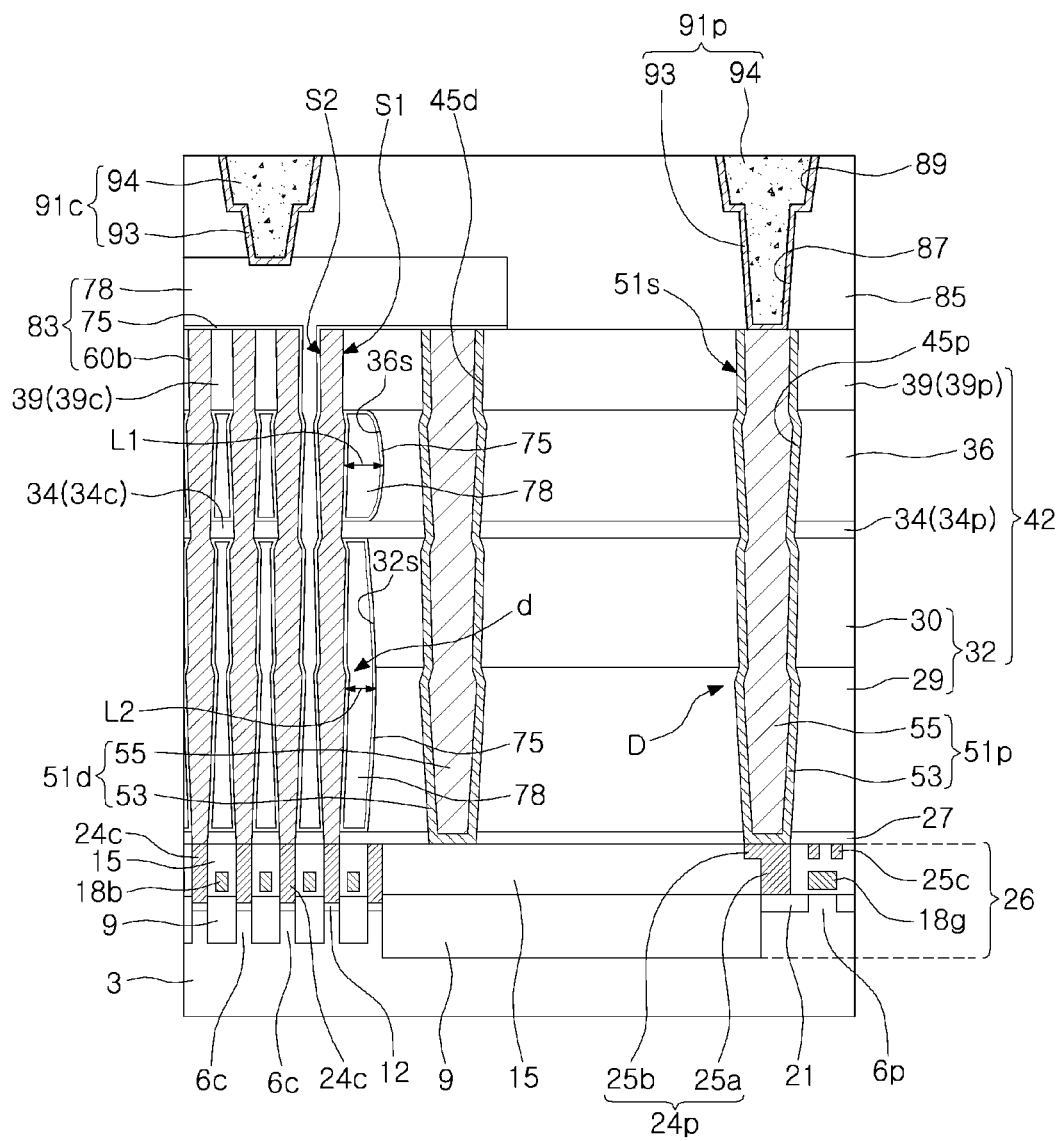
FIG. 3B is a cross-sectional view illustrating a different modified example of a semiconductor device according to an example embodiment.
Figure 4:
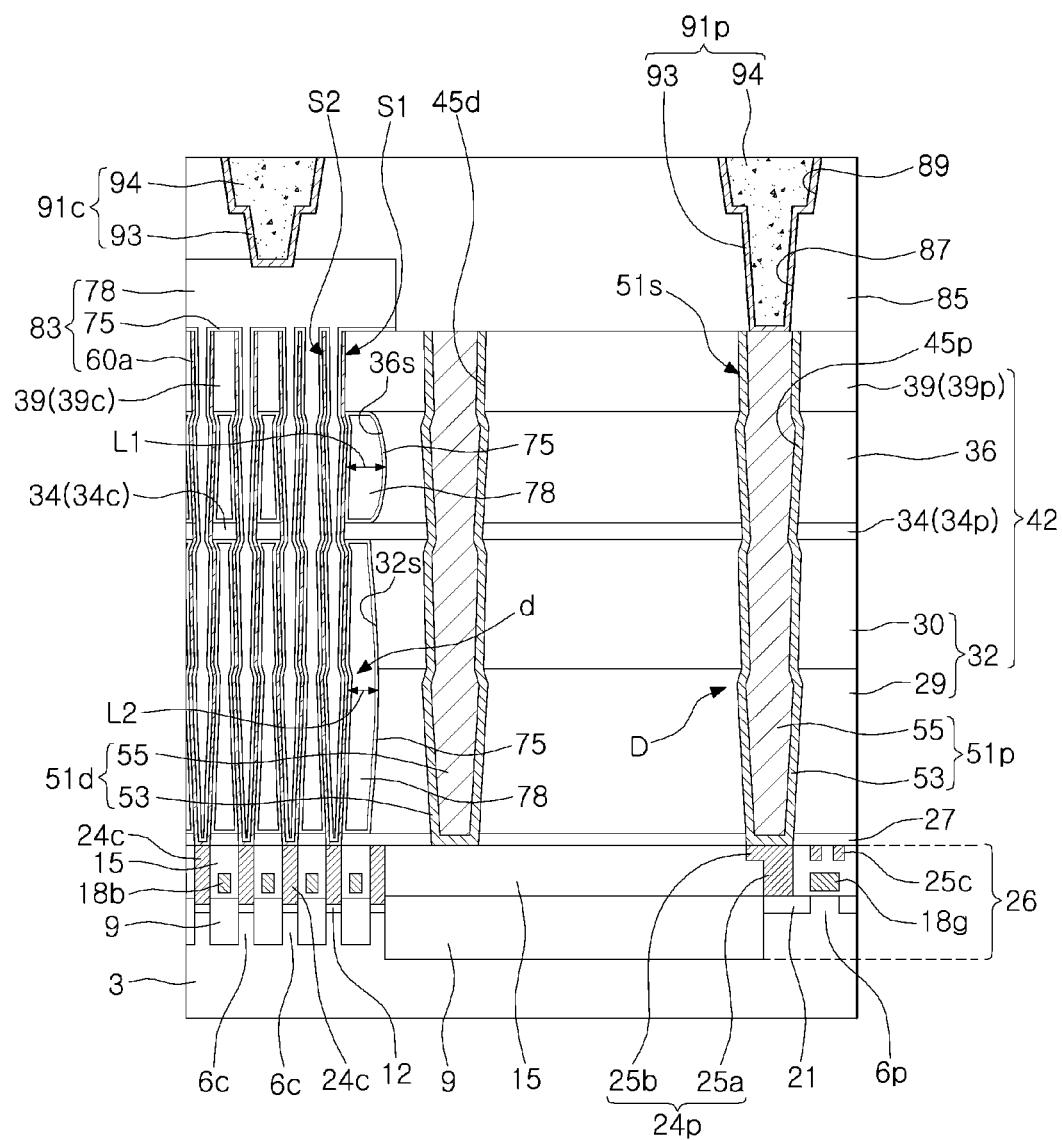
FIG. 4 is a cross-sectional view illustrating a different modified example of a semiconductor device according to an example embodiment.

With reference to FIGS. 1A to 4, examples of a semiconductor device according to an example embodiment will be described. In FIGS. 1A to 4, FIG. 1A is a cross-sectional view provided to describe an example of a semiconductor device according to an example embodiment, FIG. 1B is a partially enlarged view in which portion 'A' of FIG. 1A is enlarged, FIG. 2 is a cross-sectional view provided to describe a modified example of a semiconductor device according to an example embodiment, FIG. 3A is a cross-sectional view provided to describe another modified example of a semiconductor device according to an example embodiment, FIG. 3B is a cross-sectional view provided to describe a different modified example of a semiconductor device according to an example embodiment, and FIG. 4 is a cross-sectional view provided to describe a different modified example of a semiconductor device according to an example embodiment.

As used herein, a semiconductor device may refer to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

First, with reference to FIGS. 1A and 1B, an example of a semiconductor device according to an example embodiment will be described.

With reference to FIGS. 1A and 1B, a lower structure 26 may be disposed on a substrate 3. The substrate 3 may be a semiconductor substrate.

The lower structure 26 may include an isolation region 9, defining first active regions 6c and a second active region 6p. The isolation region 9 may be a trench isolation region. The first active regions 6c may be cell active regions inside a memory cell array region of a memory device, such as a dynamic random access memory (DRAM), or the like, and the second active region 6p may be a peripheral active region inside a peripheral circuit region of a memory device, such as a DRAM, or the like.

The lower structure 26 may include first contact areas 24c, a second contact area 24p, and an insulating material layer 15. The insulating material layer 15 may be disposed on the first active region 6c and the second active region 6p, and the isolation region 9. The first contact areas 24c pass through (e.g., penetrate) the insulating material layer 15 to be electrically connected to first impurity regions 12, inside the first active regions 6c. The second contact area 24p passes through (e.g., penetrates) the insulating material layer 15 to be electrically connected to a second impurity region 21, inside the second active region 6p. In some embodiments, a surface area of the second impurity region 21 may be larger than a surface area of each of the first impurity regions 12. The first impurity regions 12 may be one of a source or a drain of a memory cell switching device, and the second impurity region 21 may be a peripheral source/drain of a peripheral transistor. The second contact area 24p may include a plug portion 25a in contact with the second impurity region 21, and a contact area 25b above (e.g., directly above) the plug portion 25a.

The lower structure 26 may include bit lines 18b, adjacent to the first contact areas 24c and disposed on the first active regions 6c. The lower structure 26 may include a peripheral gate electrode 18g, adjacent to the second contact area 24p and disposed on the second active region 6p, and peripheral interconnections 25c above the peripheral gate electrode 18g. At least a portion of the peripheral gate electrode 18g may be disposed in the same plane as the bit lines 18b. For example, the lower most surface of the peripheral gate electrode 18g may be disposed in the same plane as the lower most surface of each of the bit lines 18b.

An etch stop layer 27 may be disposed on the lower structure 26. An interlayer insulating structure 42 may be disposed on the etch stop layer 27. The interlayer insulating structure 42 may include a lower interlayer insulating layer 32 (which may also be referred to as a first interlayer insulating layer), a lower support layer 34 (which may also be referred to as a first support layer), an upper interlayer insulating layer 36 (which may also be referred to as a second interlayer insulating layer), and an upper support layer 39 (which may also be referred to as a second support layer), sequentially stacked on the etch stop layer 27. For example, in some embodiments, the uppermost surface of the etch stop layer 27 contacts the lowermost surface of the lower interlayer insulating layer 32, the uppermost surface of the lower interlayer insulating layer 32 contacts the lowermost surface of the lower support layer 34, the uppermost surface of the lower support layer 34 contacts the lowermost surface of upper interlayer insulating layer 36, and the uppermost surface of the upper interlayer insulating layer 36 contacts the lowermost surface of the upper support layer 39.

In some embodiments, the lower interlayer insulating layer 32 may be thicker than the upper interlayer insulating layer 36. For example, the lower interlayer insulating layer 32 may have a thickness in an upward direction perpendicular to the substrate 3 greater than a thickness of the upper interlayer insulating layer 36 in the upward direction perpendicular to the substrate 3. The upper support layer 39 may have a thickness thinner than those of the upper interlayer insulating layer 36 and the lower interlayer insulating layer 32. For example, the upper support layer 39 may have a thickness in an upward direction perpendicular to the substrate 3 smaller than a thickness of the upper interlayer insulating layer 36 in the upward direction perpendicular to the substrate 3. In some embodiments, the thickness of the upper support layer 39 in the upward direction perpendicular to the substrate 3 may also be smaller than a thickness of the lower interlayer insulating layer 32 in the upward direction perpendicular to the substrate 3. The upper support layer 39 may be thicker than the lower support layer 34. For example, in some embodiments, the upper support layer 39 may have a thickness in an upward direction perpendicular to the substrate 3 larger than a thickness of the lower support layer 34 in the upward direction perpendicular to the substrate 3.

The upper support layer 39 may include a first portion 39p overlapping the lower interlayer insulating layer 32 and the upper interlayer insulating layer 36, and a second portion 39c not overlapping the lower interlayer insulating layer 32 and the upper interlayer insulating layer 36. For example, the lower most surface of the first portion 39p of the upper support layer 39 contacts the uppermost surface of the upper interlayer insulating layer 36 and the lower most surface of the second portion 39c of the upper support layer 39 does not contact the uppermost surface of the upper interlayer insulating layer 36. The lower support layer 34 may include a first portion 34p overlapping the lower interlayer insulating layer 32 and a second portion 34c not overlapping the lower interlayer insulating layer 32. For example, the lower most surface of the first portion 34p of the lower support layer 34 contacts the uppermost surface of the lower interlayer insulating layer 32 and the lower most surface of the second portion 34c of the lower support layer 34 does not contact the uppermost surface of the lower interlayer insulating layer 32. Thus, the lower interlayer insulating layer 32 and the upper interlayer insulating layer 36 may be disposed between the first portion 39p of the upper support layer 39 and the substrate 3. In addition, the lower interlayer insulating layer 32 may be disposed between the first portion 34p of the lower support layer 34 and the substrate 3.

The lower interlayer insulating layer 32 may include a lower layer 29 and an upper layer 30 above the lower layer 29. The upper support layer 39 and the lower support layer 34 may be formed of an insulating material with etch selectivity with respect to the lower layer 29 and the upper layer 30, as well as to the upper interlayer insulating layer 36. For example, the upper support layer 39 and the lower support layer 34 may be formed of a nitride-based insulating material, and the lower layer 29 and the upper layer 30, as well as the upper interlayer insulating layer 36, may be formed of an oxide-based insulating material. For example, the upper support layer 39 and the lower support layer 34 may be formed of silicon nitride. The lower layer 29 and the upper layer 30 may be formed of different oxides. For example, the lower layer 29 may be formed of boron phospho-silicate glass (BPSG) oxide, and the upper layer 30 may be formed of tetraethyl orthosilicate (TEOS) oxide. The etch stop layer 27 may be formed of an insulating material with etch selectivity with respect to the lower interlayer insulating layer 32, for example, a nitride-based insulating material such as silicon nitride, or the like.

First electrodes 60a and a contact structure 51p may be disposed above the lower structure 26 (e.g., on the etch stop layer 27).

The contact structure 51p may be disposed inside a peripheral contact hole 45p passing through (e.g., penetrating) the first portion 39p of the upper support layer 39, the upper interlayer insulating layer 36, the first portion 34p of the lower support layer 34, the lower interlayer insulating layer 32, and the etch stop layer 27, to be electrically connected to the second contact area 24p of the lower structure 26. The contact structure 51p may be in contact with the first portion 39p of the upper support layer 39, the upper interlayer insulating layer 36, the first portion 34p of the lower support layer 34, and the lower interlayer insulating layer 32.

The contact structure 51p may pass through (e.g., penetrate) the first portion 39p of the upper support layer 39, the upper interlayer insulating layer 36, the first portion 34p of the lower support layer 34, the lower interlayer insulating layer 32, and the etch stop layer 27. Thus, an upper side surface 51s of the contact structure 51p may be surrounded by the first portion 39p of the upper support layer 39.

The contact structure 51p may have a side profile whose width is extended in a position adjacent to a boundary between layers adjacent to each other inside the interlayer insulating structure 42, or at a boundary part. For example, the contact structure 51p may have a width extended portion D in a position adjacent to a boundary between the lower layer 29 and the upper layer 30, for example, in an upper region of the lower layer 29. Thus, since a total volume of the contact structure 51p is increased, electrical characteristics of the contact structure 51p may be improved.

The first electrodes 60a may be electrically connected to the first contact areas 24c. The first electrodes 60a may be in contact with the first contact areas 24c to be extended in a direction perpendicular to the substrate 3. Upper side surfaces S1 and S2 of the first electrodes 60a may be surrounded by the second portion 39c of the upper support layer 39. The first electrodes 60a may have portions, in contact with the second portion 34c of the lower support layer 34 and the second portion 39c of the upper support layer 39. For example, at least the upper side surface S1 of the upper side surfaces S1 and S2 of the first electrodes 60a, may be in contact with the second portion 39c of the upper support layer 39. For example, the upper side surfaces S1 and S2 of the first electrodes 60a may have the upper side surfaces S1 in contact with the second portion 39c of the upper support layer 39 and the upper side surfaces S2 not in contact with the upper support layer 39.

The second portion 34c of the lower support layer 34 and the second portion 39c of the upper support layer 39 may fill a gap between side surfaces of the first electrodes 60a so as to prevent the first electrodes 60a from being deformed or collapsed. Thus, a defect of a semiconductor device, caused by deformation or collapsing of the first electrodes 60a, may be prevented.

The first electrodes 60a may have a side profile corresponding to the side profile of the contact structure 51p. For example, the first electrodes 60a may have a width extended portion d in a position corresponding to the width extended portion D in the contact structure 51p. In this exemplary embodiment, a "corresponding position" may be interpreted as a position located in the same plane (e.g., a plane parallel to the top surface of the substrate 3). Thus, as a surface area of the first electrodes 60a is increased, capacity of a DRAM cell capacitor, including the first electrodes 60a, may be increased. Thus, performance of a semiconductor device may be improved.

The first electrodes 60a may not overlap the lower interlayer insulating layer 32 and the upper interlayer insulating layer 36. The first electrodes 60a may be spaced apart from the lower interlayer insulating layer 32 and the upper interlayer insulating layer 36. For example, the first electrodes 60a may be spaced apart from the lower interlayer insulating layer 32 and the upper interlayer insulating layer 36 in a direction longitudinal (e.g., horizontal) to the top surface of the substrate 3. The lower interlayer insulating layer 32 may have a side surface 32s opposing the first electrodes 60a, and the upper interlayer insulating layer 36 may have a side surface 36s opposing the first electrodes 60a. The side surfaces 32s and 36s of the lower interlayer insulating layer 32 and the upper interlayer insulating layer 36, respectively, opposing the first electrodes 60a, may be concave in a horizontal direction. In this exemplary embodiment, a "horizontal direction" refers to a direction parallel to a surface (e.g., top surface) of the substrate 3. The side surface 32s of the lower interlayer insulating layer 32 and the side surface 36s of the upper interlayer insulating layer 36 may have different curvatures. In some embodiments, the side surface 32s of the lower interlayer insulating layer 32 may have a curvature greater than that of the side surface 36s of the upper interlayer insulating layer 36. For example, a distance L1 between a concave portion of the side surface 36s of the upper interlayer insulating layer 36 and the first electrodes 60a may be greater in the horizontal direction than a distance L2 between a concave portion of the side surface 32s of the lower interlayer insulating layer 32 and the first electrodes 60a in the horizontal direction.

A dielectric 75 and a second electrode 78 may be disposed on and above the first electrodes 60a.

The second electrode 78 may cover the first electrodes 60a. The second electrode 78 may be disposed between the first electrodes 60a, and between the first electrodes 60a and the side surface 32s of the lower interlayer insulating layer 32, to be extended onto an upper surface of the second portion 39c of the upper support layer 39. In addition, the second electrode 78 covers the upper surface of the second portion 39c of the upper support layer 39, to be extended upwardly of the first portion 39p of the upper support layer 39. A portion of the second electrode 78 extended upwardly of the first portion 39p of the upper support layer 39 may be located at a level higher than that of an upper surface of the contact structure 51p. The dielectric 75 may be disposed between the first electrodes 60a and the second electrode 78, between the lower support layer 34 and the second electrode 78, between the side surface 32s of the lower interlayer insulating layer 32 and the second electrode 78, between the side surface 36s of the upper interlayer insulating layer 36 and the second electrode 78, and between the upper support layer 39 and the second electrode 78.

As described previously, the upper side surfaces S1 and S2 of the first electrodes 60a may have the upper side surfaces S1 in contact with the second portion 39c of the upper support layer 39, and the upper side surfaces S2 not in contact with the upper support layer 39. In this exemplary embodiment, in the upper side surfaces S1 and S2 of the first electrodes 60a, the upper side surfaces not in contact with the upper support layer 39 may be in contact with the dielectric 75.

The dielectric 75 and the second electrode 78 may be disposed within a space between the side surface 36s of the upper interlayer insulating layer 36 and the first electrodes 60a. For example, in the space between the side surface 36s of the upper interlayer insulating layer 36 and the first electrodes 60a, the second electrode 78 may be disposed between the side surface 36s of the upper interlayer insulating layer 36 and the first electrodes 60a, and the dielectric 75 may surround the second electrode 78 within the space and may be in contact with the side surface 36s of the upper interlayer insulating layer 36. The dielectric 75 may be interposed between the first electrodes 60a and the second electrode 78, between the upper support layer 39 and the second electrode 78, between the lower support layer 34 and the second electrode 78, and between the side surface 36s of the upper interlayer insulating layer 36 and the second electrode 78. The dielectric 75 may be extended from a part interposed between the first electrodes 60a and the second electrode 78 to a gap between the side surface 36s of the upper interlayer insulating layer 36 and the second electrode 78.

In a space between the side surface 32s of the lower interlayer insulating layer 32 and the first electrodes 60a, the second electrode 78 may be disposed between the side surface 32s of the lower interlayer insulating layer 32 and the first electrodes 60a, and the dielectric 75 may be interposed between the first electrodes 60a and the second electrode 78, between the lower support layer 34 and the second electrode 78, between the etch stop layer 27 and the second electrode 78, and between the side surface 36s of the upper interlayer insulating layer 36 and the second electrode 78. The dielectric 75 may be extended from a part interposed between the first electrodes 60a and the second electrode 78 to a gap between the side surface 32s of the lower interlayer insulating layer 32 and the second electrode 78.

The first electrodes 60a, the dielectric 75, and the second electrode 78 may form a data storage element 83. For example, the data storage element 83 may be a DRAM cell capacitor storing data in a memory cell array such as a DRAM.

The first electrodes 60a may include a conductive material such as metal, metal nitride, metal oxide, metal silicide, conductive carbon, or combinations thereof. For example, the first electrodes 60a may include titanium (Ti), titanium nitride (TiN), titanium aluminium nitride (TiAlN), titanium carbo-nitride (TiCN), tantalum (Ta), tantalum nitride (TaN), tantalum aluminium nitride (TaAlN), tantalum carbo-nitride (TaCN), ruthenium (Ru), platinum (Pt), or combinations thereof. The dielectric 75 may include a high-k dielectric, silicon oxide, silicon nitride, silicon oxynitride, or combinations thereof. The second electrode 78 may include a conductive material such as metal, metal nitride, metal oxide, conductive carbon, a semiconductor alloy, or combinations thereof. The semiconductor alloy may include a silicon-germanium (SiGe) material.

The contact structure 51p may include a barrier layer 53 and a contact plug 55. The contact plug 55 of the contact structure 51p may have a pillar shape, continuously or integrally passing through (e.g., penetrating) the first portion 39p of the upper support layer 39, the upper interlayer insulating layer 36, the first portion 34p of the lower support layer 34, the lower interlayer insulating layer 32, and the etch stop layer 27. In addition, the barrier layer 53 of the contact structure 51p may surround a side surface of the contact plug 55 of the contact structure 51p, to cover a bottom of the contact plug 55. The barrier layer 53 of the contact structure 51p may include Ti, Ta, TaN, TiN, tungsten nitride (WN), or combinations thereof, and the contact plug 55 of the contact structure 51p may be, for example, conductive plugs formed of a conductive material such as a metal. For example, the contact plug 55 may include a metal such as tungsten (W), or the like. The contact structure 51p may include a conductive material different from the first electrodes 60a. For example, when the first electrodes 60a are formed of TiN, the contact structure 51p may include W.

An inter-metal insulating layer 85, covering the upper support layer 39 and the data storage element 83, may be disposed. The inter-metal insulating layer 85 may be formed of an insulating material having permittivity lower than that of the interlayer insulating structure 42. For example, the inter-metal insulating layer 85 may be formed of a low-k dielectric such as carbon-doped silicon oxide (SiOCH), or the like.

A first interconnection structure 91c and a second interconnection structure 91p may be disposed within the inter-metal insulating layer 85. The first interconnection structure 91c and the second interconnection structure 91p may fill a via hole 87 and an interconnection trench 89 within the inter-metal insulating layer 85. The first interconnection structure 91c may be electrically connected to the second electrode 78, and the second interconnection structure 91p may be electrically connected to the contact structure 51p.

Each of the first interconnection structure 91c and the second interconnection structure 91p may include a first conductive layer 93 and a second conductive layer 94. The second conductive layer 94 of each of the first interconnection structure 91c and the second interconnection structure 91p may be formed of a metal such as copper, or the like. The first conductive layer 93 of each of the first interconnection structure 91c and the second interconnection structure 91p may cover a side surface and a bottom of the second conductive layer 94 of each of the first interconnection structure 91c and the second interconnection structure 91p. The first conductive layer 93 of each of the first interconnection structure 91c and the second interconnection structure 91p may include a barrier layer and/or a seed layer.

In an example embodiment, the first electrodes 60a may have a cylindrical shape. Thus, the dielectric 75 may cover an outer side surface of the first electrodes 60a to conformally cover inner walls of the first electrodes 60a having the cylindrical shape.

According to an example embodiment, the first electrodes 60a may have a cylindrical shape, but an example embodiment is not limited thereto. The first electrodes 60a having the cylindrical shape may be deformed to be first electrodes 60b having a pillar shape, as illustrated in FIG. 2.

In a different modified example of a semiconductor device according to an example embodiment, as illustrated in FIG. 3A, a dam structure 51d, disposed between the second electrode 78 and the contact structure 51p may be included. The dam structure 51d will be described with reference to FIG. 3A.

With reference to FIG. 3A, the dam structure 51d may be disposed within a groove 45d passing through (e.g., penetrating) the interlayer insulating structure 42 and the etch stop layer 27. Thus, the dam structure 51d may be in contact with the lower interlayer insulating layer 32 and the upper interlayer insulating layer 36, as well as the lower support layer 34 and the upper support layer 39. In addition, the dam structure 51d may pass through the interlayer insulating structure 42 and the etch stop layer 27 to be in contact with the insulating material layer 15 of the lower structure 26.

The dam structure 51d may be formed of the same material as that of the contact structure 51p. For example, the dam structure 51d may include the barrier layer 53 and the contact plug 55, in the same manner as the contact structure 51p.

The dam structure 51d, the contact structure 51p, and the upper support layer 39 may have upper surfaces coplanar with each other.

The second electrode 78 may be extended upwardly of the dam structure 51d. In addition, the dielectric 75 may be extended between the second electrode 78 and the dam structure 51d. Thus, the dam structure 51d may overlap the second electrode 78 to be spaced apart from the second electrode 78.

A side profile of the dam structure 51d may correspond to the side profile of the contact structure 51p. For example, the dam structure 51d may have a side profile whose width is extended in a position adjacent to a boundary between layers adjacent to each other within the interlayer insulating structure 42, in a manner similar to the contact structure 51p.

In a different modified example of a semiconductor device according to an example embodiment including the dam structure 51d as described with reference to FIG. 3A, the first electrodes 60a may be the first electrodes 60a having a cylindrical shape, as described with reference to FIG. 1A, but an example embodiment is not limited thereto. For example, the first electrodes 60a having a cylindrical shape may be deformed to be the first electrodes 60b having a pillar shape, as described with reference to FIG. 2. Thus, as illustrated in FIG. 3B, a semiconductor device including first electrodes 60b having a pillar shape, in addition to the dam structure 51d, may be provided.

Referring again to FIG. 3A, the second electrode 78 may overlap the dam structure 51d, but an example embodiment is not limited thereto. For example, as illustrated in FIG. 4, a second electrode 78 may not overlap the dam structure 51d. Thus, an upper surface of the dam structure 51d may be covered with the inter-metal insulating layer 85.

Figure 5:
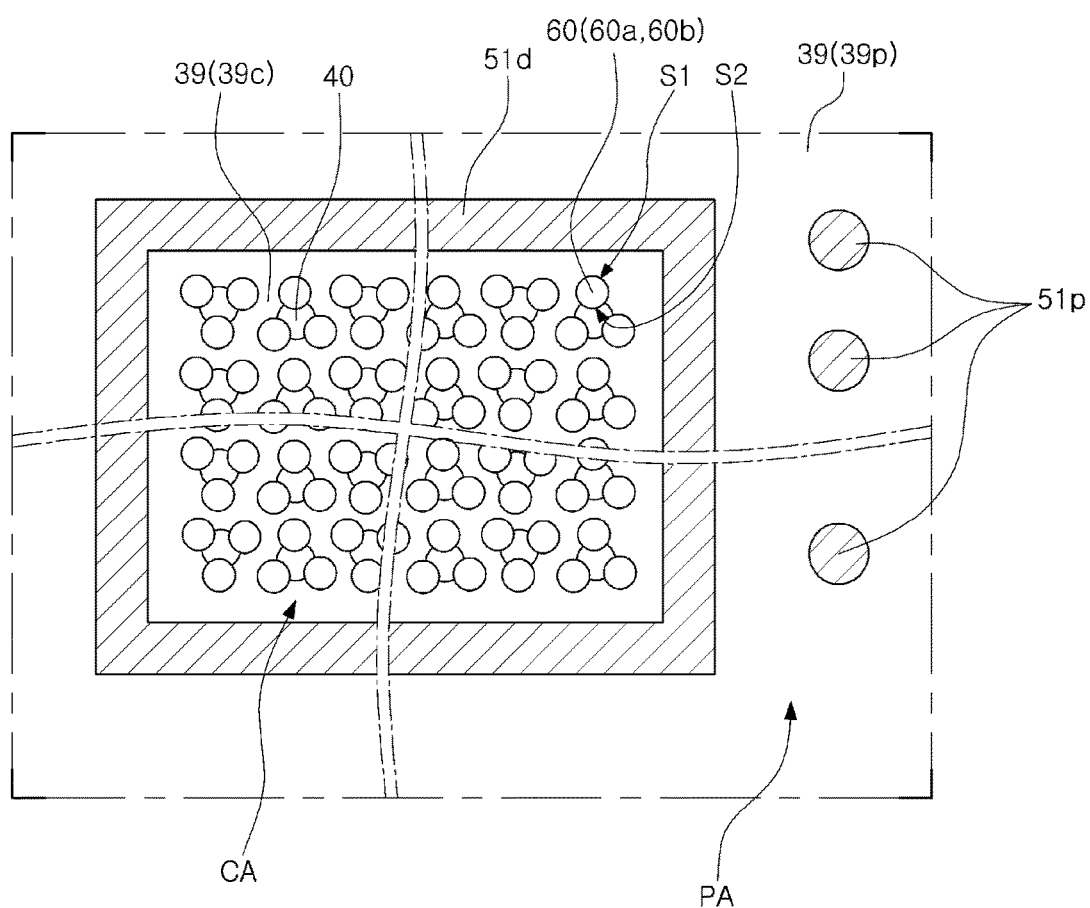
FIG. 5 is a plan view illustrating a semiconductor device according to an example embodiment.

FIG. 5 is a plan view provided to describe planar shapes of several elements in example embodiments described with reference to FIGS. 1A, 2, 3A, 3B, and 4. Hereinafter, examples of several elements described with reference to FIGS. 1A to 4 will be described.

With reference to FIG. 5, in addition to a drawing or an example embodiment of FIGS. 1A, 2, 3A, 3B, and 4, first electrodes 60 may be disposed in a memory cell array region CA, and the contact structure 51p may be disposed in a peripheral circuit region PA.

The first electrodes 60 may be the first electrodes 60a having a cylindrical shape, as described with reference to FIGS. 1A and 3A, or may be the first electrodes 60b having a pillar shape, as described with reference to FIGS. 2 and 3B. The contact structure 51p may be provided as a plurality of contact structures.

A region on the substrate 3, in which the data storage element 83, including the first electrodes 60, is formed, is defined as the memory cell array region CA, and a region on the substrate 3 surrounding the memory cell array region CA is defined as the peripheral circuit region PA. Thus, the first electrodes 60 may be disposed on the memory cell array region CA of the substrate 3, and the contact structure 51p may be disposed on the peripheral circuit region PA of the substrate 3.

The second portion 39c of the upper support layer 39 may have openings 40. The openings 40 of the second portion 39c of the upper support layer 39 may be disposed within the memory cell array region CA of the substrate 3. The first electrodes 60 may have first side surfaces S1 in contact with the second portion 39c of the upper support layer 39, and second side surfaces S2 not in contact with the upper support layer 39. The second side surfaces S2 of the first electrodes 60 may be side surfaces exposed by the openings 40 of the upper support layer 39. The second portion 39c of the upper support layer 39 may be in contact with the first electrodes 60 so as to prevent the first electrodes 60 from being deformed or collapsed.

The first portion 39p of the upper support layer 39 may be disposed within the peripheral circuit region PA. The first portion 39p of the upper support layer 39 described above may serve to protect the peripheral circuit region PA. For example, the first portion 39p of the upper support layer 39 may prevent a transistor, disposed in a lower part of the first portion 39p of the upper support layer 39, from being degraded. The transistor may include the peripheral gate electrode 18g above the second active region 6p, and the second impurity region 21 disposed in the second active region 6p, as described with reference to FIG. 1A.

Throughout the specification, the first portion 39p of the upper support layer 39 may be referred to as a "protecting part" or a "protecting layer", and the second portion 39c of the upper support layer 39 may be referred to as a "supporter". In addition, "the upper support layer 39" may be referred to as an "upper support/protecting layer". Similarly, the first portion 34p of the lower support layer 34 may be referred to as a "protecting part" or a "protecting layer", and the second portion 34c of the lower support layer 34 may be referred to as a "supporter". In addition, "the lower support layer 34" may be referred to as a "lower support/protecting layer".

Thus, the technical idea of the present disclosure is not limited to the term "support layer", and the term "support layer" may be understood as being able to be replaced by the term "protecting layer" throughout the description and claims.

With reference to FIG. 5, in addition to a drawing or an example embodiment of FIGS. 3A, 3B, and 4, the dam structure 51d may be disposed to have a ring shape surrounding the memory cell array region CA. Thus, the dam structure 51d may pass through the interlayer insulating structure 42 and may be in contact with the interlayer insulating structure 42. The dam structure 51d is disposed between the first electrodes 60 of the data storage element 83 and the contact structure 51p, so as to prevent an electrical short, between the data storage element 83 and the contact structure 51p, which may occur during a semiconductor process of forming the data storage element 83. In addition, since the dam structure 51d is disposed, a gap between the contact structure 51p and the first electrodes 60 may be significantly reduced, thereby improving integration of a semiconductor device.

Each of FIGS. 6, 7, 8, and 9 is a partially enlarged view provided to describe several elements in example embodiments, described with reference to FIGS. 1A, 2, 3A, 3B, and 4.

Figure 6:
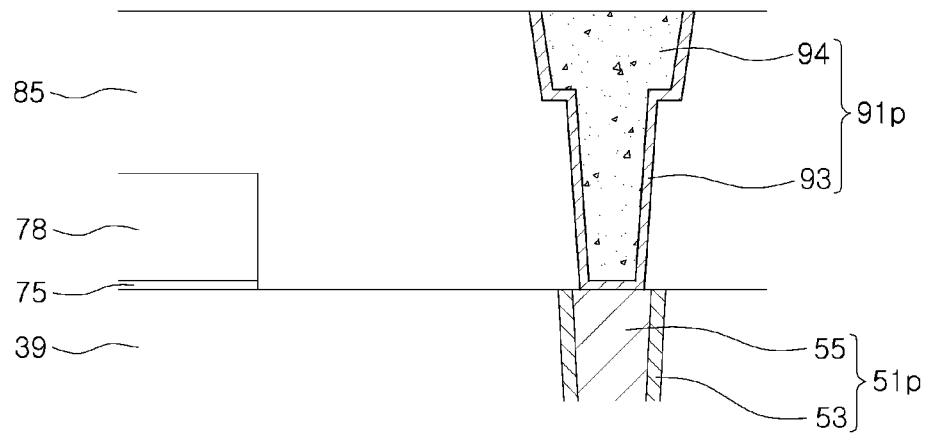
FIG. 6 is a cross-sectional view illustrating an example of a semiconductor device according to an example embodiment.
Figure 7:
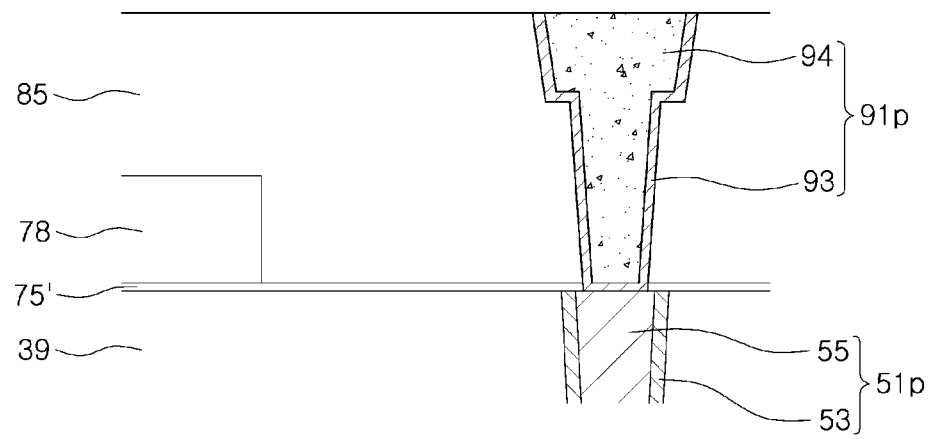
FIG. 7 is a cross-sectional view illustrating another example of a semiconductor device according to an example embodiment.

First, with reference to FIG. 6, in addition to a drawing or an example embodiment of FIGS. 1A, 2, 3A, 3B, and 4, the dielectric 75 may be interposed between the second electrode 78 and the upper support layer 39, and may not be extended between the inter-metal insulating layer 85 and the upper support layer 39, but an example embodiment is not limited thereto. For example, as illustrated in FIG. 7, the dielectric (75, in FIG. 6) may be deformed to be a dielectric (75', in FIG. 7) interposed between the second electrode 78 and the upper support layer 39 to be extended between the inter-metal insulating layer 85 and the upper support layer 39.

Figure 8:
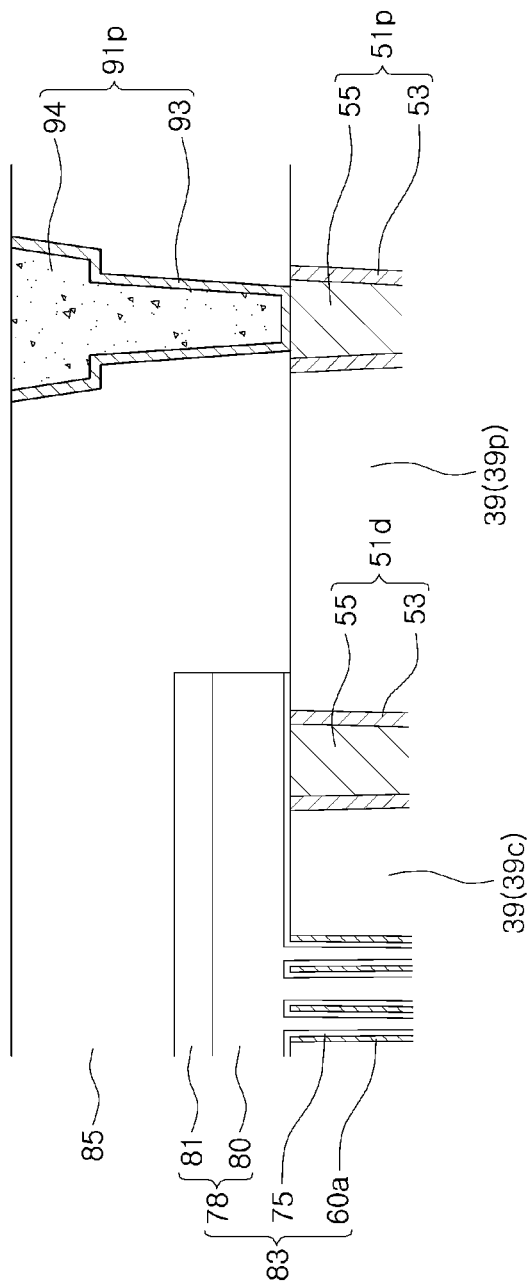
FIG. 8 is a cross-sectional view illustrating a different example of a semiconductor device according to an example embodiment.
Figure 9:
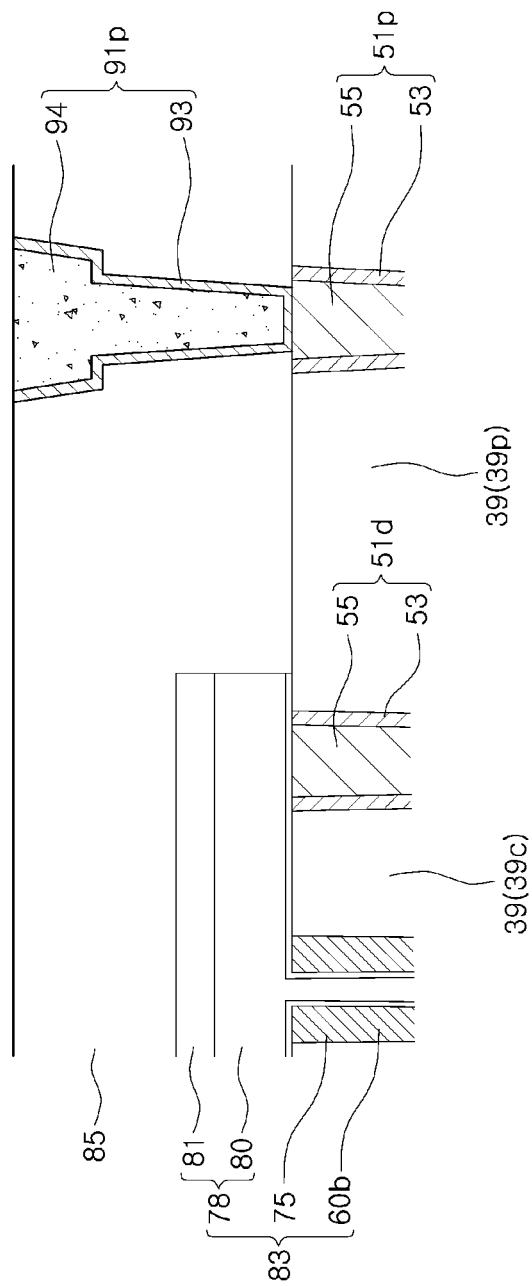
FIG. 9 is a cross-sectional view illustrating a different example of a semiconductor device according to an example embodiment.

The second electrode 78, in FIGS. 1A, 2, 3A, 3B, and 4, may be formed as a single layer, but an example embodiment is not limited thereto. The second electrode 78 may be deformed to include at least two or more layers. A modified example of the second electrode 78 described above will be described with reference to FIGS. 8 and 9. In FIGS. 8 and 9, FIG. 8 is a view based on FIG. 3A, and FIG. 9 is a view based on FIG. 3B. The modified example of the second electrode 78 described above may be applied to the second electrode 78 illustrated in each of FIGS. 3A and 3B, and thus, the modified example of the second electrode 78 will be described with reference to FIGS. 8 and 9 at the same time.

With reference to FIGS. 8 and 9, the second electrode 78 may include a first material layer 80 and a second material layer 81 above the first material layer 80. The first material layer 80 may fill a gap between the first electrodes 60a, to be extended upwardly of the upper support layer 39. The first material layer 80 may be formed of a material having excellent gap filling properties, with which a gap between the first electrodes 60a is filled without a defect, for example, a SiGe material, and the second material layer 81 may be formed of a material having excellent electrical characteristics, for example, a metal (e.g., W, or the like) and/or metal nitride (e.g., TiN, or the like). The second electrode 78, including the first material layer 80 and the second material layer 81 described above, may be applied to the second electrode 78 having a pillar shape, described with reference to FIGS. 1A and 2.

Next, with reference to FIGS. 10A to 10J, an example of a method of forming a semiconductor device according to example embodiments will be described.

Figure 10A:
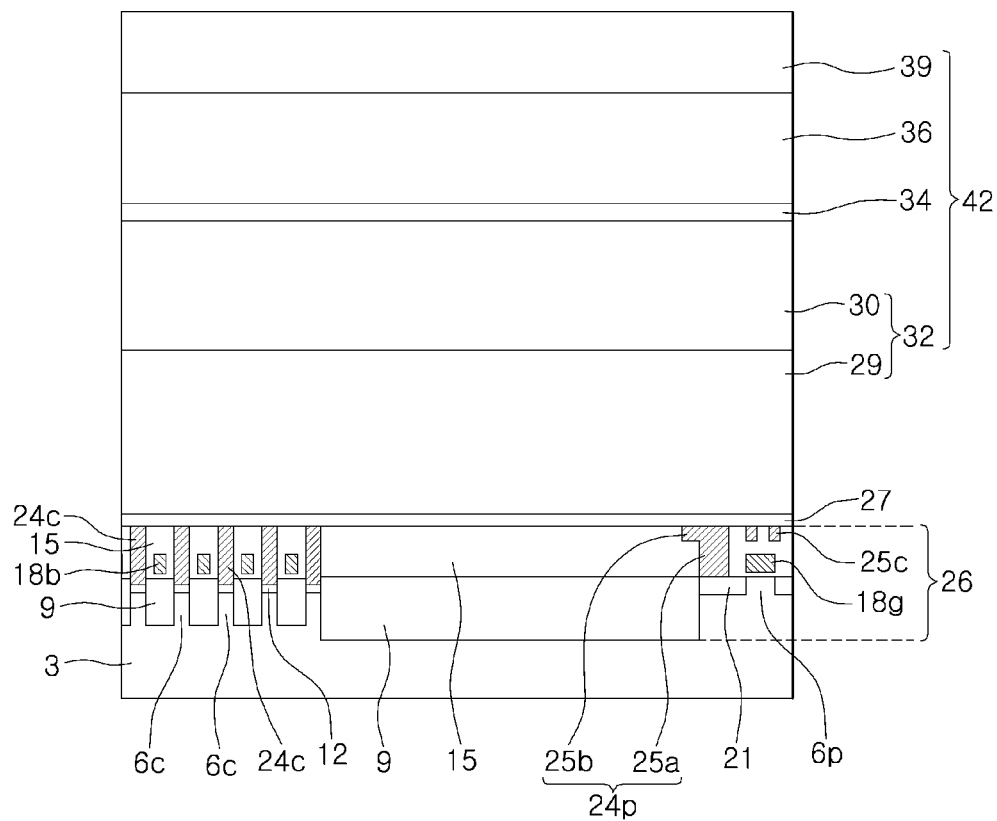
FIGS. 10A to 10J are cross-sectional views illustrating an example of a method of forming a semiconductor device according to an example embodiment.

With reference to FIG. 10A, a lower structure 26 may be formed on a substrate 3. The substrate 3 may be a semiconductor substrate. The lower structure 26 may include an isolation region 9 formed on the substrate 3 and defining a first active region 6c and a second active region 6p, bit lines 18b embedded in the insulating material layer 15, a peripheral gate electrode 18g embedded in the insulating material layer 15, and peripheral interconnections 25c above the peripheral gate electrode 18g. In addition, the lower structure may include first contact areas 24c and a second contact areas 24p, passing through (e.g., penetrating) the insulating material layer 15. The first contact areas 24c may pass through the insulating material layer 15 to be electrically connected to first impurity regions 12 within the first active regions 6c. The first impurity regions 12 may be one of a source or a drain of a cell switching device of a memory device such as a DRAM, or the like. The second contact area 24p may include a plug portion 25a passing through the insulating material layer 15 to be electrically connected to a second impurity region 21 within the second active region 6p, and a contact area 25b above the plug portion 25a. The second impurity region 21 may be a source/drain of a peripheral transistor.

An etch stop layer 27 may be formed above the lower structure 26. The etch stop layer 27 may be formed of an insulating material such as silicon nitride, or the like.

An interlayer insulating structure 42 may be formed on the etch stop layer 27. The interlayer insulating structure 42 may include a lower interlayer insulating layer 32, a lower support layer 34, an upper interlayer insulating layer 36, and an upper support layer 39, sequentially stacked. The lower interlayer insulating layer 32 may be formed to be thicker than the upper interlayer insulating layer 36. The upper support layer 39 may be formed to be thicker than the lower support layer 34. For example, in some embodiments, the lower interlayer insulating layer 32 may have a thickness in an upward direction perpendicular to the substrate 3 larger than a thickness of the upper insulating layer 36 in the upward direction perpendicular to the substrate 3 and the upper support layer 39 may have a thickness in an upward direction perpendicular to the substrate 3 larger than a thickness of the lower support layer 34 in the upward direction perpendicular to the substrate 3.

The lower interlayer insulating layer 32 may include a lower layer 29 formed on the etch stop layer 27, and an upper layer 30 formed on the lower layer 29. The lower layer 29 and the upper layer 30 may be formed of different oxides.

The lower support layer 34 and the upper support layer 39 may be formed of an insulating material with etch selectivity with respect to the lower interlayer insulating layer 32 and the upper interlayer insulating layer 36. The lower interlayer insulating layer 32 and the upper interlayer insulating layer 36 may be formed of a silicon oxide-based material, and the lower support layer 34 and the upper support layer 39 may be formed of a silicon nitride-based material.

Figure 10B:
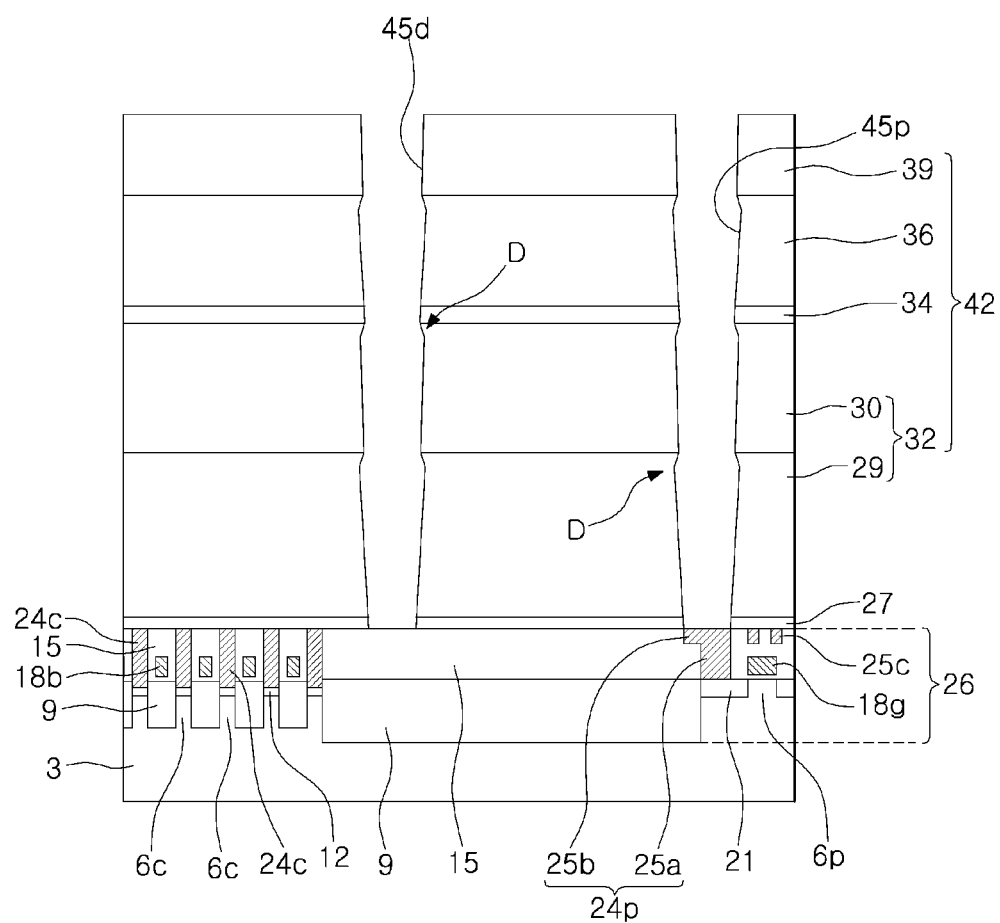

With reference to FIG. 10B, a peripheral contact hole 45p, passing through (e.g., penetrating) the interlayer insulating structure 42 and the etch stop layer 27, may be formed. The peripheral contact hole 45p may expose the second contact area 24p.

In an example embodiment, while the peripheral contact hole 45p is being formed, a groove 45d passing through the interlayer insulating structure 42 may also be formed. The groove 45d may expose the insulating material layer 15.

Each of the peripheral contact hole 45p and the groove 45d may include a width extended portion D. For example, the width extended portion D of each of the peripheral contact hole 45p and the groove 45d may be formed in a position adjacent to a boundary between layers adjacent to each other within the interlayer insulating structure 42. For example, the width extended portion D of each of the peripheral contact hole 45p and the groove 45d may be formed in a position adjacent to a boundary between the upper support layer 39 and the upper interlayer insulating layer 36, a position adjacent to a boundary between the lower support layer 34 and the lower interlayer insulating layer 32, and/or a position adjacent to a boundary between the lower layer 29 and the upper layer 30. The width extended portion D of each of the peripheral contact hole 45p and the groove 45d may be a portion in which a width is increased, and then the width is decreased again.

Figure 10C:
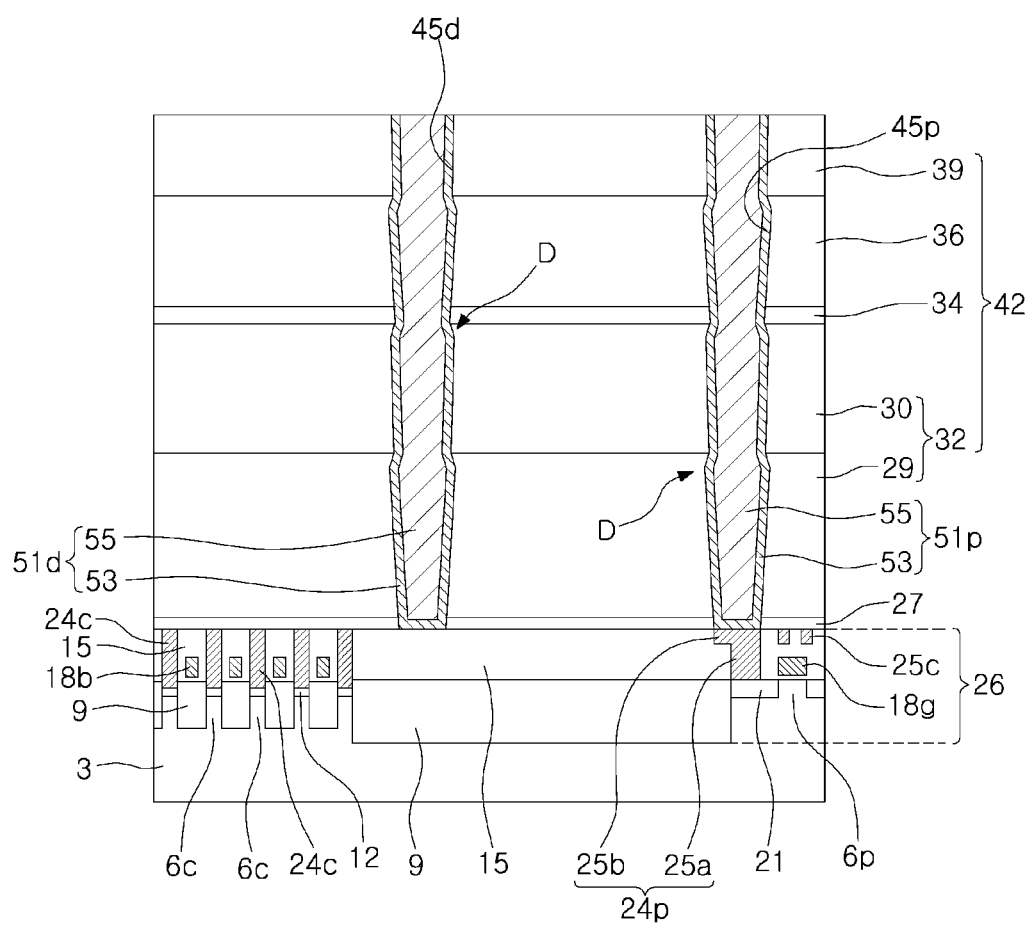

With reference to FIG. 10C, a contact structure 51p filling the peripheral contact hole 45p and a dam structure 51d filling the groove 45d may be formed.

Forming the contact structure 51p and the dam structure 51d may include conformally forming a barrier layer 53 on a substrate having the peripheral contact hole 45p and the groove 45d, forming a contact plug 55 filling the peripheral contact hole 45p and the groove 45d on the barrier layer 53, and planarizing the barrier layer 53 and the contact plug 55 until the interlayer insulating structure 42 is exposed. The planarizing may be performed using a chemical mechanical polishing (CMP) process and/or an etch-back process.

Figure 10D:
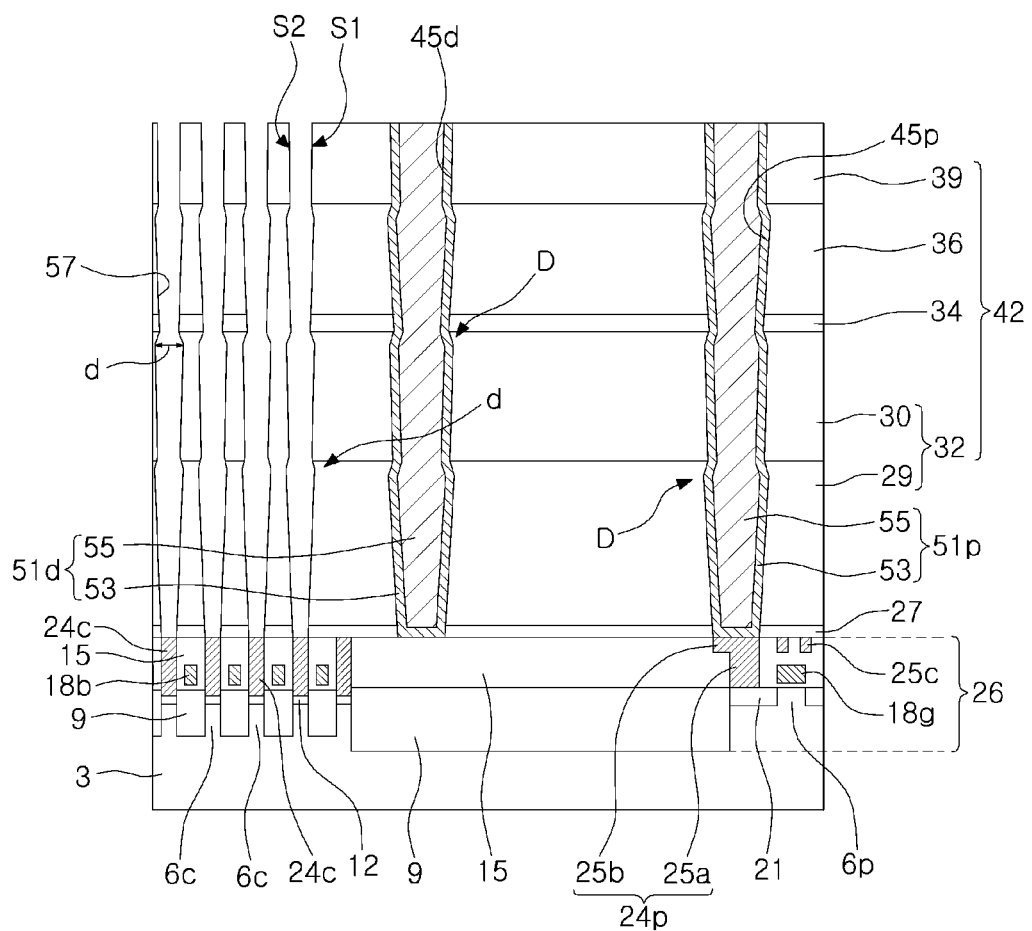

With reference to FIG. 10D, holes 57 passing through the interlayer insulating structure 42 and the etch stop layer 27 to expose the first contact areas 24c may be formed. Each of the holes 57 may be formed to have a width smaller than that of the peripheral contact hole 45p. Each of the holes 57 may include a width extended portion d, in a manner similar to the peripheral contact hole 45p described with reference to FIG. 10B. For example, the width extended portion d of the holes 57 may be formed in a position adjacent to a boundary between layers adjacent to each other within the interlayer insulating structure 42. For example, the width extended portion d of the holes 57 may be formed in a position adjacent to a boundary between the upper support layer 39 and the upper interlayer insulating layer 36, a position adjacent to a boundary between the lower support layer 34 and the lower interlayer insulating layer 32, and/or a position adjacent to a boundary between the lower layer 29 and the upper layer 30. For example, the holes 57 may have an extended portion in a lower portion of upper side surfaces S1 and S2 of a portion passing through (e.g., penetrating) the upper support layer 39. Thus, a side profile of the holes 57 may be the same as a side profile of the peripheral contact hole 45p, or may have a similar tendency.

Figure 10E:
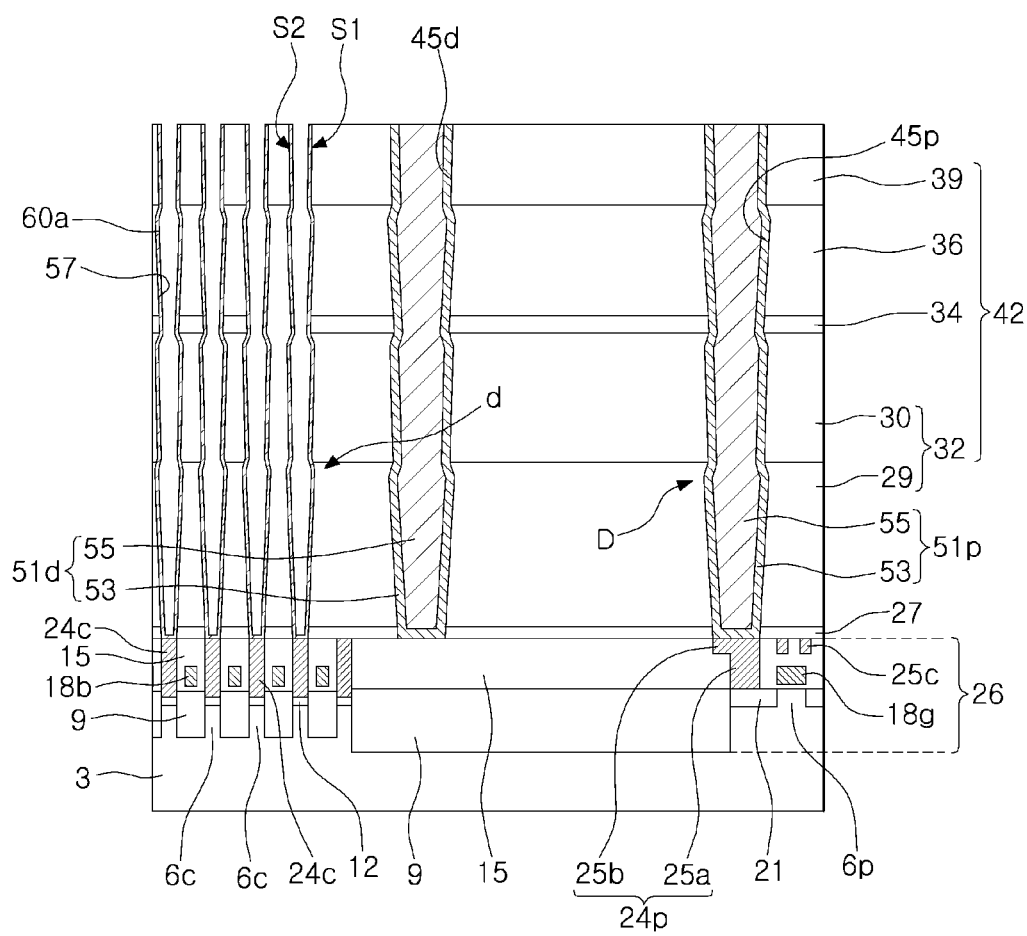

With reference to FIG. 10E, first electrodes 60a may be formed within the holes 57. In one example, the first electrodes 60a may have a cylindrical shape conformally formed along an inner wall of the holes 57. For example, the first electrodes 60a may have a cylindrical shape, but an example embodiment is not limited thereto. For example, the first electrodes 60a may be provided as the first electrodes (60b in FIGS. 2 and 3B) having a pillar shape, filling the holes 57, as described with reference to FIGS. 2 and 3B.

Figure 10F:
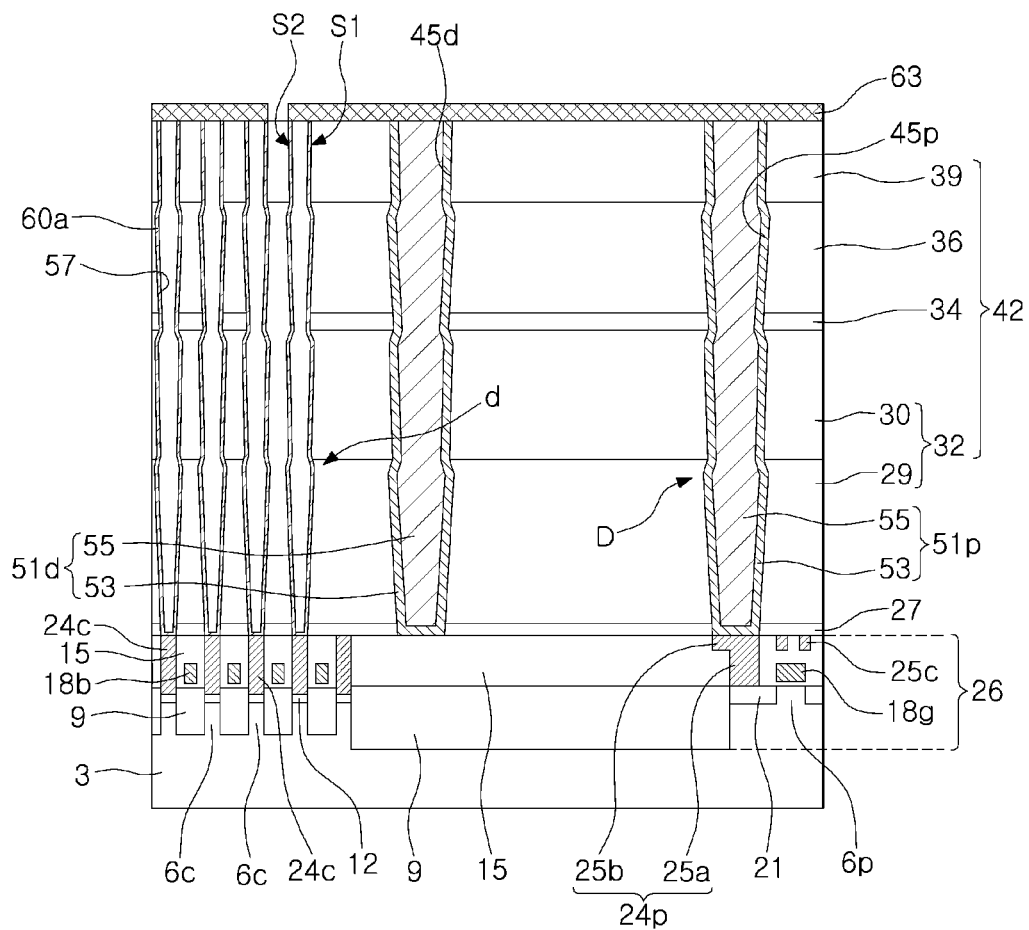

With reference to FIG. 10F, a mask 63 may be formed on a substrate having the first electrodes 60a. The mask 63 may expose a portion of the upper support layer 39 between the first electrodes 60a.

Figure 10G:
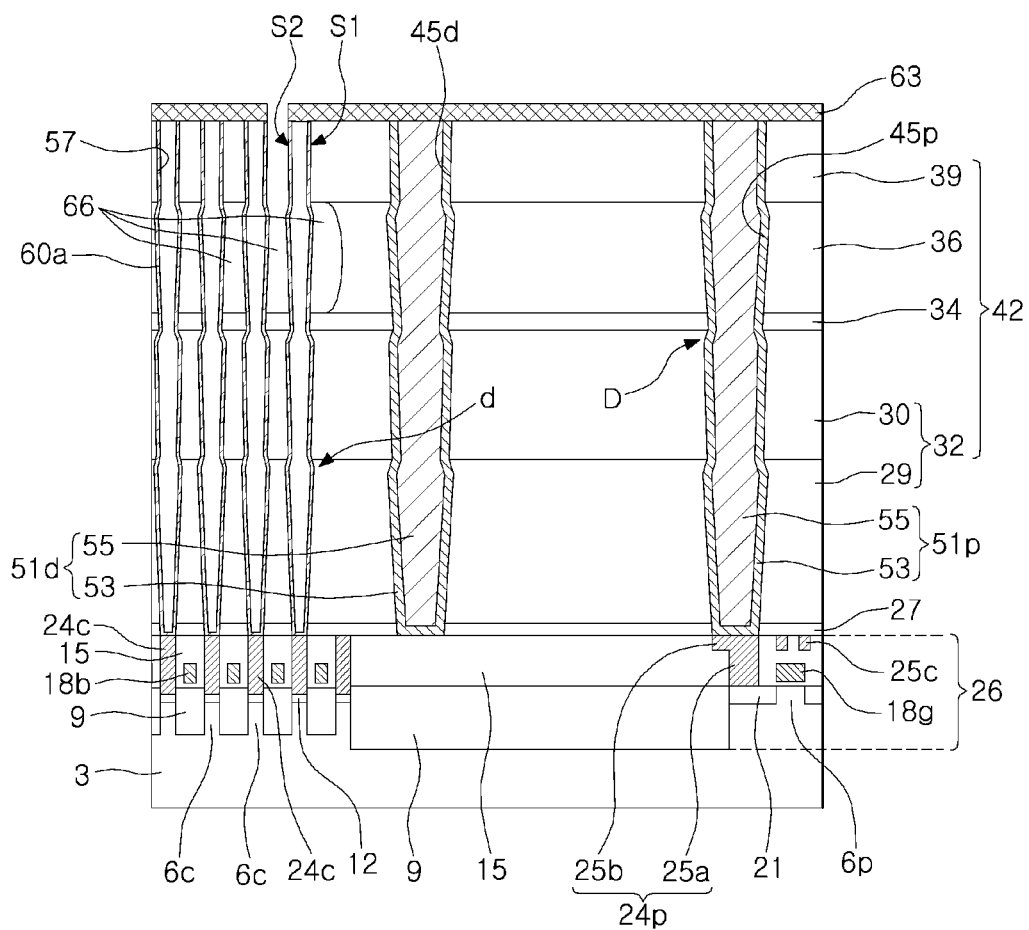

With reference to FIG. 10G, the mask 63 is used as an etching mask to etch the upper support layer 39, thereby exposing the upper interlayer insulating layer 36, and the upper interlayer insulating layer 36 is etched to expose the lower support layer 34.

In some example embodiments, during an etching process for exposing the lower support layer 34, the upper interlayer insulating layer 36 is partially etched, and thus, an upper opening 66 exposing side surfaces of the first electrodes 60a may be formed.

Figure 10H:
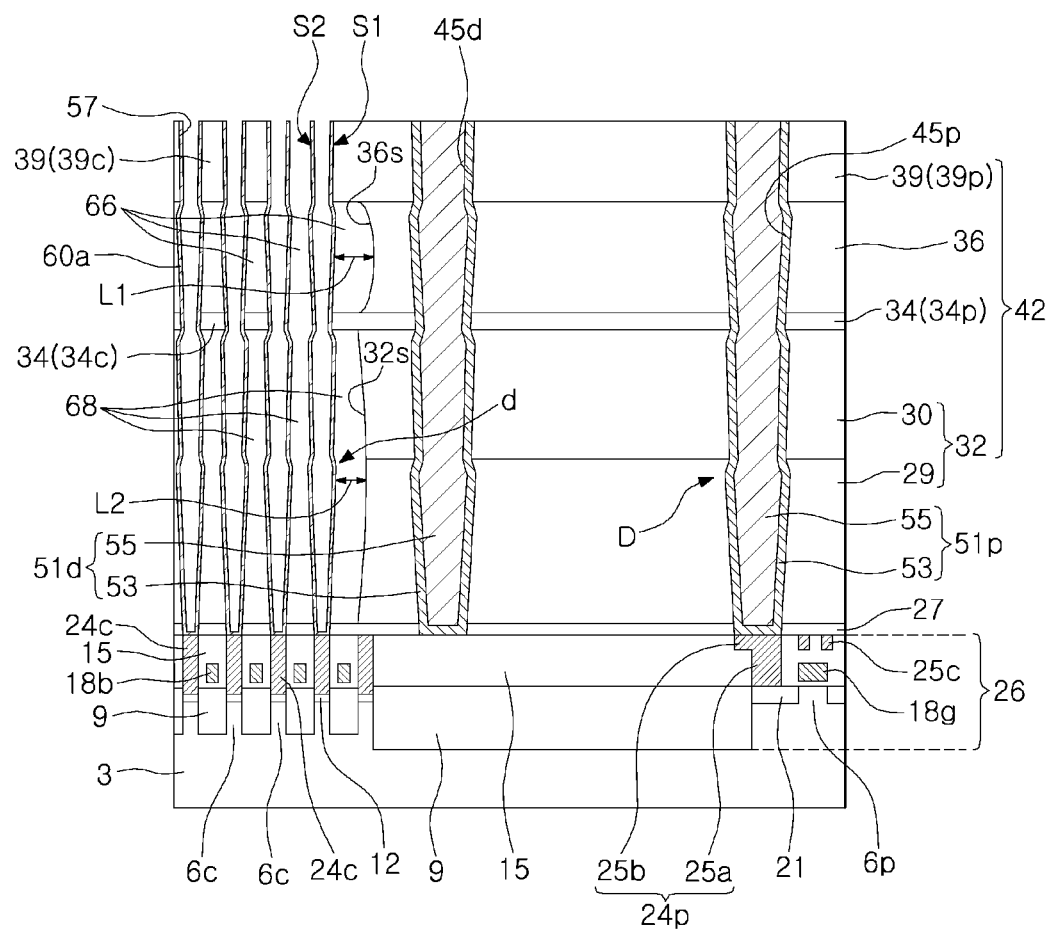

With reference to FIG. 10H, the lower support layer 34 is etched to expose the lower interlayer insulating layer 32, and then the lower interlayer insulating layer 32, which is exposed, may be etched to form a lower opening 68 exposing side surfaces of the first electrodes 60a. While the lower interlayer insulating layer 32 is etched, the upper interlayer insulating layer 36 is also etched to expand the upper opening 66.

To form the lower opening 68 and the upper opening 66, etching the lower interlayer insulating layer 32 and the upper interlayer insulating layer 36 may be performed using an isotropic etching process. Thus, the lower interlayer insulating layer 32 and the upper interlayer insulating layer 36 may be formed to have side surfaces 32s and 36s, which are concave.

The side surface 32s of the lower interlayer insulating layer 32 may have a curvature greater than that of the side surface 36s of the upper interlayer insulating layer 36. A distance L1 between a concave portion of the side surface 36s of the upper interlayer insulating layer 36 and the first electrodes 60a may be greater than a distance L2 between a concave portion of the side surface 32s of the lower interlayer insulating layer 32 and the first electrodes 60a.

As the lower interlayer insulating layer 32 and the upper interlayer insulating layer 36 are etched to form the lower opening 68 and the upper opening 66, a portion of the upper support layer 39 may not overlap the lower interlayer insulating layer 32 and the upper interlayer insulating layer 36. Thus, the upper support layer 39 may have a first portion 39p overlapping the lower interlayer insulating layer 32 and the upper interlayer insulating layer 36 and a second portion 39c not overlapping the lower interlayer insulating layer 32 and the upper interlayer insulating layer 36. In a manner similar thereto, the lower support layer 34 may have a first portion 34p overlapping the lower interlayer insulating layer 32, and a second portion 34c not overlapping the lower interlayer insulating layer 32.

The second portions 34c and 39c of the lower support layer 34 and the upper support layer 39 may fill a gap between side walls of the first electrodes 60a so as to prevent a defect such as collapsing, bending, or the like, of the first electrodes 60a.

Figure 10I:
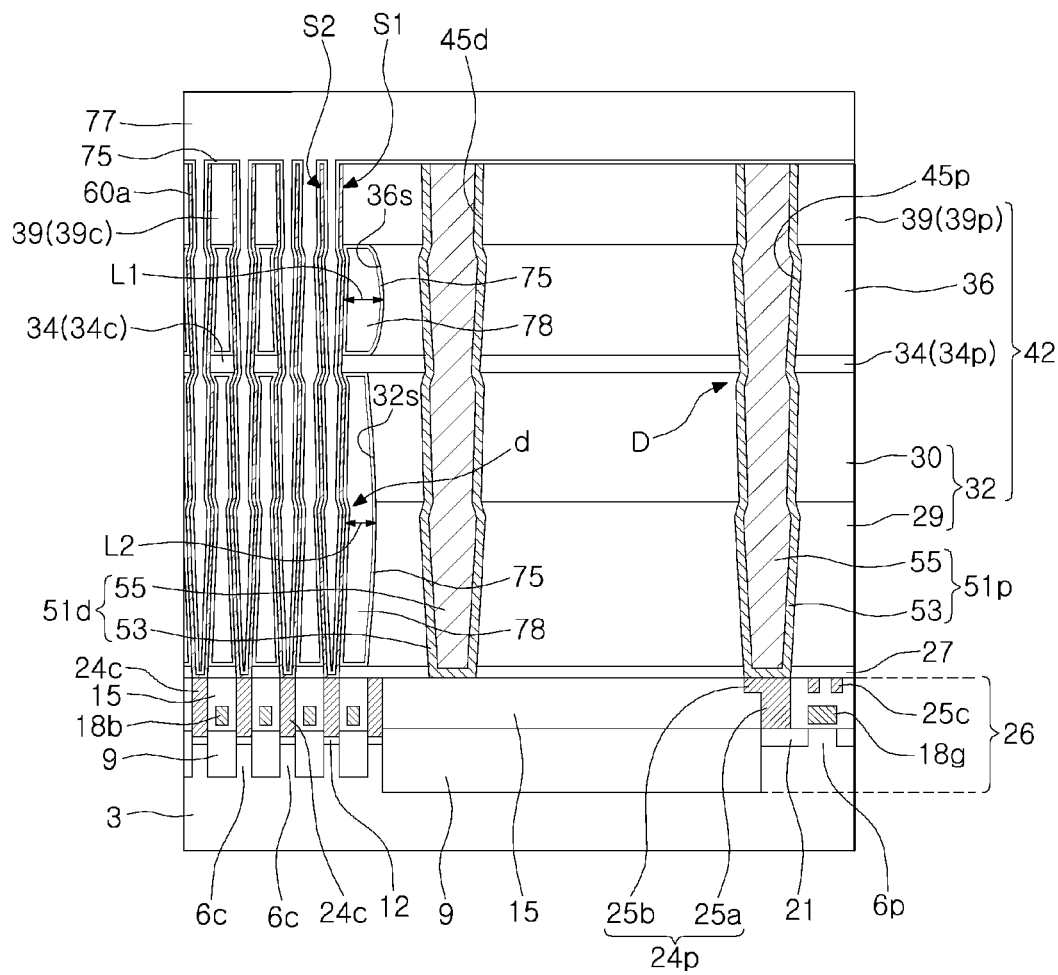

With reference to FIG. 10I, a dielectric 75 may be conformally formed on a substrate having the upper opening (66 of FIG. 10H) and the lower opening (68 of FIG. 10H), and a second electrode layer 77, filling the upper opening (66 of FIG. 10H) and the lower opening (68 of FIG. 10H) to cover the upper support layer 39, may be formed on the dielectric 75.

Figure 10J:
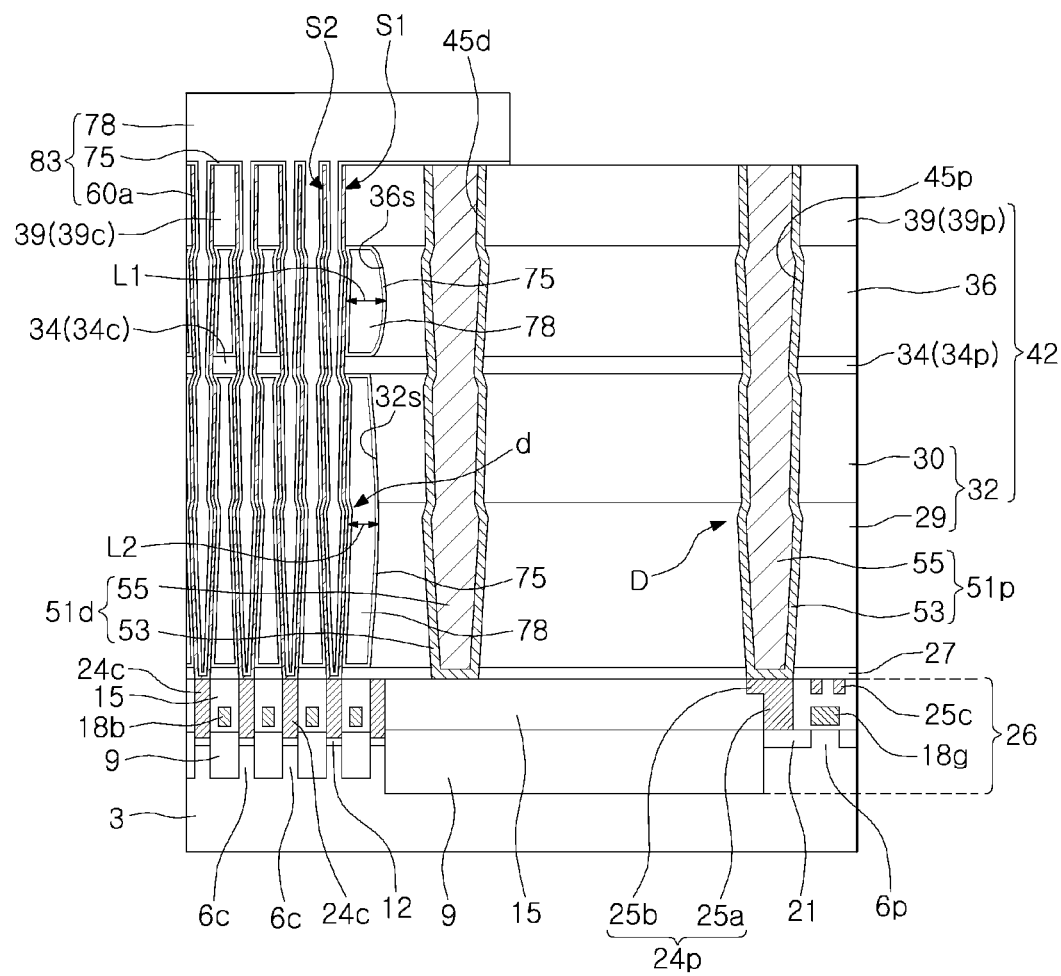

With reference to FIG. 10J, the second electrode layer 77 is patterned to form a second electrode 78. The first electrodes 60a, the dielectric 75, and the second electrode 78 may form a data storage element 83. For example, the data storage element 83 may be a DRAM cell capacitor storing data in a memory cell array such as a DRAM.

In one example, the dielectric 75, which is exposed while the second electrode layer 77 is patterned to form the second electrode 78, may be etched.

In one example, the second electrode 78 may overlap the dam structure 51d, but an example embodiment is not limited thereto. For example, the second electrode 78 may not overlap the dam structure 51d.

Referring again to FIG. 3A, an inter-metal insulating layer 85, covering the upper support layer 39 and the data storage element 83, may be formed. The inter-metal insulating layer 85 may be formed of an insulating material having permittivity lower than that of the interlayer insulating structure 42. As a damascene process is performed, a first interconnection structure 91c and a second interconnection structure 91p may be formed within the inter-metal insulating layer 85. Forming the first interconnection structure 91c and the second interconnection structure 91p may include forming a damascene opening, for example, a via hole 87 and a interconnection trench 89, within the inter-metal insulating layer 85, conformally forming a first conductive layer 93, forming a second conductive layer 94 filling the via hole 87 and the interconnection trench 89 on the first conductive layer 93, and planarizing the second conductive layer 94 and the first conductive layer 93 until the inter-metal insulating layer 85 is exposed.

According to example embodiments, after the contact structure 51p is formed, cell capacitors in a memory cell array region, that is, the data storage element 83, may be formed. Thus, the data storage element 83 is prevented from being degraded by heat generated while the contact structure 51p is formed.

As set forth above, according to example embodiments of the present disclosure, a semiconductor device including a support layer may be provided. The support layer may be disposed between first electrodes formed on a substrate. The support layer may prevent the first electrodes from being deformed or collapsed. Thus, a defect of a semiconductor device occurring due to deformation or collapsing of the first electrodes may be prevented. In addition, the support layer may be extended from a memory cell array in which the first electrodes are formed to a peripheral circuit region around the memory cell array, to cover the peripheral circuit region. The support layer extended on the peripheral circuit region may serve to prevent circuits located below the support layer, for example, a peripheral transistor, from being degraded.

In addition, after a contact structure is formed in a peripheral circuit region, a cell capacitor may be formed on a memory cell array region. Thus, the cell capacitor is prevented from being degraded by heat generated while the contact structure is formed.

While example embodiments have been shown and described above, it will be apparent to those skilled in the art that modifications and variations could be made without departing from the scope of the present disclosure, as defined by the appended claims.

What is claimed is:

1. A semiconductor device, comprising:
   an upper interlayer insulating layer disposed on a substrate;
   a first electrode disposed on the substrate and spaced apart from the upper interlayer insulating layer;
   a contact structure disposed on the substrate and penetrating the upper interlayer insulating layer;
   an upper support layer including a first portion covering an upper surface of the upper interlayer insulating layer and surrounding an upper side surface of the contact structure, and a second portion extending in a horizontal direction from the first portion and surrounding an upper side surface of the first electrode;
   a dielectric conformally covering the first electrode; and
   a second electrode on the dielectric,
   wherein the second electrode covers an upper surface of the second portion of the upper support layer, to extend upwardly from the first portion of the upper support layer, and
   wherein a portion of the second electrode, which extends upwardly from the first portion of the upper support layer, is located at a level higher than that of an upper surface of the contact structure.

2. The semiconductor device of claim 1, wherein the upper support layer has a thickness in an upward direction perpendicular to the substrate smaller than a thickness of the upper interlayer insulating layer in the upward direction perpendicular to the substrate and is formed of a material having etch selectivity with respect to the upper interlayer insulating layer.

3. The semiconductor device of claim 1, further comprising a lower structure on the substrate,
   wherein the lower structure includes a first contact area, a bit line adjacent to the first contact area, a second contact area, and a peripheral gate electrode adjacent to the second contact area,
   the first electrode being disposed on the first contact area,
   the contact structure being disposed on the second contact area,
   at least a portion of the peripheral gate electrode being disposed in a same plane as the bit line.

4. The semiconductor device of claim 1, further comprising:
   a lower interlayer insulating layer disposed between the substrate and the upper interlayer insulating layer and spaced apart from the first electrode; and
   a lower support layer interposed between the lower interlayer insulating layer and the upper interlayer insulating layer, extending in a horizontal direction, and surrounding a portion of a side surface of the first electrode.

5. The semiconductor device of claim 4, wherein a side surface of the lower interlayer insulating layer opposing the first electrode has a curvature greater than that of a side surface of the upper interlayer insulating layer opposing the first electrode.

6. The semiconductor device of claim 4, wherein the contact structure includes: a contact plug continuously penetrating the first portion of the upper support layer, the upper interlayer insulating layer, the lower support layer, and the lower interlayer insulating layer; and a barrier layer surrounding a side surface of the contact plug.

7. The semiconductor device of claim 4, wherein the lower interlayer insulating layer includes a lower layer and an upper layer, and
   a width of the contact structure is extended in a region adjacent to a boundary of the lower layer and the upper layer.

8. The semiconductor device of claim 1, further comprising a space between the first electrode and a side surface of the upper interlayer insulating layer opposing the first electrode,
   wherein a second portion of the second electrode is disposed inside the space, and
   a portion of the dielectric surrounds the second electrode inside the space and is in contact with the side surface of the upper interlayer insulating layer.

9. The semiconductor device of claim 1, further comprising a dam structure disposed between the first electrode and the contact structure,
   the first electrode being disposed in a memory cell array region of the substrate,
   the contact structure being disposed in a peripheral circuit region of the substrate,
   the dam structure being disposed between the memory cell array region and the peripheral circuit region and surrounding the cell array region,
   the dam structure, the contact structure, and the upper support layer having upper surfaces coplanar with each other.

10. A semiconductor device, comprising:
    an interlayer insulating layer disposed on a substrate;
    an upper support layer including a first portion covering an upper surface of the interlayer insulating layer and a second portion formed to extend in a horizontal direction from the first portion;
    a contact structure penetrating the first portion of the upper support layer and the interlayer insulating layer; and
    a data storage element disposed on the substrate and spaced apart from the contact structure,
    the data storage element including a first electrode spaced apart from the interlayer insulating layer, a dielectric on the first electrode, and a second electrode on the dielectric,
    an upper side surface of the first electrode being surrounded by the second portion of the upper support layer,
    an upper side surface of the contact structure being surrounded by the first portion of the upper support layer and being in contact with the first portion,
    at least a portion of the upper side surface of the first electrode being in contact with the second portion of the upper support layer, the second electrode covering an upper surface of the second portion of the upper support layer.

11. The semiconductor device of claim 10, further comprising a dam structure disposed between the first electrode and the contact structure and surrounding the first electrode, wherein the dam structure has an upper surface coplanar with an upper surface of the contact structure.

12. The semiconductor device of claim 11, wherein the second electrode extends upwardly from the dam structure, and
the dielectric extends between the second electrode and the dam structure.

13. The semiconductor device of claim 10, wherein the contact structure includes a contact plug and a barrier layer surrounding a side surface of the contact plug, and
the contact plug continuously penetrates the first portion of the upper support layer and the interlayer insulating layer.

14. The semiconductor device of claim 10, further comprising:
an inter-metal insulating layer disposed on the upper support layer, covering the second electrode, and formed of a dielectric having permittivity lower than that of the interlayer insulating layer;
a first interconnection structure penetrating the inter-metal insulating layer and electrically connected to the second electrode; and
a second interconnection structure penetrating the inter-metal insulating layer and electrically connected to the contact structure.

15. A semiconductor device, comprising:
a first interlayer insulating layer disposed on a substrate;
a second interlayer insulating layer on the first interlayer insulating layer;
a first support layer between the first interlayer insulating layer and the second interlayer insulating layer;
a second support layer on an upper surface of the second interlayer insulating layer;
a first electrode disposed on the substrate and spaced apart from the first and second interlayer insulating layers;
a contact structure disposed on the substrate and penetrating the first interlayer insulating layer, the first support layer, the second interlayer insulating layer and the second support layer;
a dielectric conformally covering the first electrode; and
a second electrode on the dielectric; and
a space between the first electrode and a side surface of the second interlayer insulating layer opposing the first electrode,
wherein a portion of the second electrode is disposed inside the space,
wherein a portion of the dielectric surrounds the second electrode inside the space and is in contact with the side surface of the second interlayer insulating layer, and
wherein the second support layer includes a first portion covering an upper surface of the second interlayer insulating layer and surrounding an upper side surface of the contact structure, and a second portion being disposed in a same plane as the first portion and contacting a portion of an upper side surface of the first electrode.

16. The semiconductor device of claim 15, wherein the first and second support layers are formed of an insulating material having etch selectivity with respect to the first and second interlayer insulating layers.

17. The semiconductor device of claim 15, wherein a thickness of the first interlayer insulating layer in an upward direction perpendicular to the substrate is greater than a thickness of the second interlayer insulating layer in the upward direction perpendicular to the substrate.

18. The semiconductor device of claim 15, wherein a thickness of the second support layer in an upward direction perpendicular to the substrate is smaller than a thickness of the second interlayer insulating layer in the upward direction perpendicular to the substrate.

19. The semiconductor device of claim 15, wherein a thickness of the second support layer in an upward direction perpendicular to the substrate is larger than a thickness of the first support layer.

* * * * *